(12) United States Patent
Ota et al.

(10) Patent No.: US 9,123,961 B2
(45) Date of Patent: Sep. 1, 2015

(54) THREE-DIMENSIONAL NET-LIKE ALUMINUM POROUS BODY, ELECTRODE USING THE ALUMINUM POROUS BODY, NONAQUEOUS ELECTROLYTE BATTERY USING THE ELECTRODE, AND NONAQUEOUS ELECTROLYTE CAPACITOR USING THE ELECTRODE

(75) Inventors: Nobuhiro Ota, Osaka (JP); Akihisa Hosoe, Osaka (JP); Masatoshi Majima, Osaka (JP); Koji Nitta, Osaka (JP); Hajime Ota, Osaka (JP); Kazuki Okuno, Osaka (JP); Koutaro Kimura, Osaka (JP); Kengo Goto, Osaka (JP); Junichi Nishimura, Imizu (JP)

(73) Assignees: SUMITOMO ELECTRIC INDUSTRIES, LTD., Osaka-shi, Osaka (JP); SUMITOMO ELECTRIC TOYAMA CO., LTD., Imizu-shi, Toyama (JP)

( * ) Notice: Subject to any disclaimer, the term of this patent is extended or adjusted under 35 U.S.C. 154(b) by 0 days.

(21) Appl. No.: 13/252,393

(22) Filed: Oct. 4, 2011

(65) Prior Publication Data
US 2012/0115035 A1 May 10, 2012
Related U.S. Application Data

(63) Continuation of application No. PCT/JP2011/062117, filed on May 26, 2011.

(30) Foreign Application Priority Data

May 31, 2010 (JP) ................................. 2010-123831
Feb. 18, 2011 (JP) ................................. 2011-032902

(51) Int. Cl.
*H01M 4/66* (2006.01)
*H01M 4/70* (2006.01)
(Continued)

(52) U.S. Cl.
CPC ................. *H01M 4/80* (2013.01); *C23C 14/18* (2013.01); *C23C 14/5846* (2013.01);
(Continued)

(58) Field of Classification Search
CPC ......... H01M 4/661; H01M 4/70; H01M 4/80; H01G 9/145; H01G 9/048; H01G 9/058; H01G 11/06; H01G 11/66; H01G 11/70; C23C 14/18; C23C 14/5846; C23C 24/087
USPC ................... 429/233, 241, 242, 245; 420/528
See application file for complete search history.

(56) References Cited

U.S. PATENT DOCUMENTS

| RE28,470 E | * 7/1975 | Webber ......................... 428/600 |
|---|---|---|
| 5,300,165 A | 4/1994 | Sugikawa |

(Continued)

FOREIGN PATENT DOCUMENTS

| JP | 56-86459 | 7/1981 |
|---|---|---|
| JP | 3-130395 | 6/1991 |

(Continued)

OTHER PUBLICATIONS
U.S. Appl. No. 13/251,376, filed Oct. 4, 2011, Ota et al.
(Continued)

*Primary Examiner* — Eugenia Wang
(74) *Attorney, Agent, or Firm* — Drinker Biddle & Reath LLP

(57) ABSTRACT

Provided are a three-dimensional net-like aluminum porous body in which the diameter of cells in the porous body is uneven in the thickness direction of the porous body; a current collector and an electrode each using the aluminum porous body; and methods for producing these members. The porous body is a three-dimensional net-like aluminum porous body in a sheet form, for a current collector, in which the diameter of cells in the porous body is uneven in the thickness direction of the porous body. When a cross section in the thickness direction of the three-dimensional net-like aluminum porous body is divided into three regions of a region 1, a region 2 and a region 3 in this order, the average cell diameter of the regions 1 and 3 is preferably different from the cell diameter of the region 2.

6 Claims, 6 Drawing Sheets

(51) Int. Cl.
*H01M 4/80* (2006.01)
*H01G 9/048* (2006.01)
*H01G 9/145* (2006.01)
*H01G 11/06* (2013.01)
*H01G 11/66* (2013.01)
*H01G 11/70* (2013.01)
*C23C 14/18* (2006.01)
*C23C 14/58* (2006.01)
*C23C 24/08* (2006.01)
*H01G 9/04* (2006.01)
*H01M 4/131* (2010.01)

(52) U.S. Cl.
CPC ............. *C23C 24/087* (2013.01); *H01G 9/048* (2013.01); *H01G 9/058* (2013.01); *H01G 9/145* (2013.01); *H01G 11/06* (2013.01); *H01G 11/66* (2013.01); *H01G 11/70* (2013.01); *H01M 4/661* (2013.01); *H01M 4/70* (2013.01); *H01M 4/131* (2013.01); *Y02E 60/13* (2013.01)

(56) References Cited

U.S. PATENT DOCUMENTS

| | | | |
|---|---|---|---|
| 5,882,822 A | 3/1999 | Iida et al. | |
| 6,465,133 B1 * | 10/2002 | Kariya et al. | 429/235 |
| 2006/0159998 A1 * | 7/2006 | Harada et al. | 429/236 |
| 2008/0299457 A1 * | 12/2008 | Muraoka et al. | 429/217 |
| 2010/0015524 A1 * | 1/2010 | Kim et al. | 429/207 |

FOREIGN PATENT DOCUMENTS

| | | |
|---|---|---|
| JP | 5-325977 | 12/1993 |
| JP | 7-138609 | 5/1995 |
| JP | 8-170126 | 7/1996 |
| JP | 2000-208144 | 7/2000 |
| JP | 2001-155739 | 6/2001 |
| JP | 3202072 | 6/2001 |
| JP | 2002-208405 | 7/2002 |
| JP | 3413662 | 4/2003 |
| JP | 2010-37569 | 2/2010 |

OTHER PUBLICATIONS

U.S. Appl. No. 13/252,409, filed Oct. 4, 2011, Ota et al.
U.S. Appl. No. 13/252,289, filed Oct. 4, 2011.
U.S. Appl. No. 13/252,290, filed Oct. 4, 2011.
U.S. Appl. No. 13/252,295, filed Oct. 4, 2011.
U.S. Appl. No. 13/252,298, filed Oct. 4, 2011.

* cited by examiner

LARGE-CELL-DIAMETER REGION
SMALL-CELL-DIAMETER REGION
LARGE-CELL-DIAMETER REGION

SMALL-CELL-DIAMETER REGION
LARGE-CELL-DIAMETER REGION
SMALL-CELL-DIAMETER REGION

LARGE-CELL-DIAMETER REGION
SMALL-CELL-DIAMETER REGION

ALUMINUM POROUS BODY SMALL IN CELL DIAMETER

ALUMINUM POROUS BODY LARGE IN CELL DIAMETER

THREE-DIMENSIONAL NET-LIKE ALUMINUM POROUS BODY, ELECTRODE USING THE ALUMINUM POROUS BODY, NONAQUEOUS ELECTROLYTE BATTERY USING THE ELECTRODE, AND NONAQUEOUS ELECTROLYTE CAPACITOR USING THE ELECTRODE

TECHNICAL FIELD

The present invention relates to a three-dimensional net-like aluminum porous body used as an electrode for a nonaqueous electrolyte battery (such as a lithium battery), a capacitor using a nonaqueous electrolyte, which may be referred to as a "capacitor" hereinafter, or some other article.

BACKGROUND ART

Metallic porous bodies having a three-dimensional net-like structure are used in the fields of various articles, such as various filters, catalyst carriers, and electrodes for batteries. For example, CELMET ((registered trade mark) manufactured by Sumitomo Electric Industries, Ltd.), which is made of a three-dimensional net-like nickel porous body (hereinafter referred to as a "nickel porous body"), is used as a material for an electrode of a battery such as a nickel hydrogen battery or a nickel cadmium battery. The CELMET is a metallic porous body having continuous pores, and is characterized by having a higher porosity (90% or more) than other porous bodies such as a metallic nonwoven fabric. This is obtained by forming a nickel layer onto the surface of a skeleton of a resin porous body having continuous pores, such as a urethane foam, treating the workpiece thermally to decompose the resin foam shaped body, and further reducing the nickel. The formation of the nickel layer is attained by painting a carbon powder or some other onto the skeleton surface of the resin foam shaped body to subject the surface to an electrically conduction treatment, and then electroplating the workpiece to precipitate nickel.

In the meantime, aluminum has excellent characteristics, such as electroconductivity, corrosion resistance and lightness, similarly to nickel. About the use thereof for batteries, the following is used as a positive electrode of a lithium battery: a member in which an active material such as lithium cobaltate is painted on surfaces of an aluminum foil. In order to improve the capacity of the positive electrode, it is conceived that a three-dimensional net-like aluminum porous body (hereinafter referred to as an "aluminum porous body"), wherein the surface area of the aluminum is made large, is used, and an active material is filled also into the aluminum. According to this form, the active material can be used even when the electrode is made thick, so that the electrode is improved in availability ratio of the active material per unit area.

As a method for producing an aluminum porous body, Patent Literature 1 describes a method of subjecting a three-dimensional net-like plastic base having internal spaces connected to each other to an aluminum vapor deposition treatment by an arc ion plating method, thereby forming a metallic aluminum layer of 2 to 20 μm thickness.

It is stated that according to this method, an aluminum porous body of 2 to 20 μm thickness is obtained; however, the porous body is not easily produced so as to have a large area since the method is based on a vapor deposition method. Depending on the thickness or the porosity of the base, the layer is not easily formed so as to be even inside the porous body. Moreover, the forming velocity of the aluminum layer is small; costs for the production increase because of a high price of facilities, and other causes; and other problems remain. Furthermore, when aluminum is made into a thick film, it is feared that the film is cracked or aluminum peels off.

Patent Literature 2 describes a method of yielding an aluminum porous body by forming a film made of a metal (such as copper) capable of producing a eutectic alloy at the melting point of aluminum, or lower onto a skeleton of a resin foam shaped body having a three-dimensional net-like structure, painting an aluminum paste thereon, and treating the workpiece thermally at a temperature of 550° C. or higher and 750° C. or lower in a non-oxidizing atmosphere, thereby removing the organic component (the resin foam) and sintering the aluminum powder.

However, according to this method, a layer that is combined with aluminum to form a eutectic alloy is unfavorably formed, so that an aluminum layer high in purity cannot be formed.

In a different method, it is conceived that a resin foam shaped body having a three-dimensional net-like structure is plated with aluminum. The method of electroplating with aluminum is itself known. However, in plating with aluminum, the affinity of aluminum with oxygen is large, and the potential thereof is lower than that of hydrogen; thus, it is difficult that electroplating therewith is conducted in a plating bath of an aqueous solution type. For this reason, about electroplating with aluminum, nonaqueous solution baths for plating have been hitherto investigated. For example, as a technique for plating a metal surface with aluminum in order to prevent the surface from being oxidized, Patent Literature 3 discloses an aluminum electroplating method of using a low-melting-point composition wherein an onium halide and an aluminum halide are mixed with each other and molten, as a plating bath, to precipitate aluminum onto a negative electrode while the water content in the bath is kept into 2% by weight or less.

However, about electroplating with aluminum, only a metal surface can be plated. There has not been known a method of electroplating a resin shaped body surface therewith, in particular, a method of electroplating a surface of a resin porous body having a three-dimensional net-like structure therewith.

CITATION LIST

Patent Literatures

Patent Literature 1: Japanese Patent No. 3413662
Patent Literature 2; Japanese Unexamined Patent Publication No. 8-170126
Patent Literature 3; Japanese Patent No. 3202072
Patent Literature 4: Japanese Unexamined Patent Publication No. 56-86459

SUMMARY OF INVENTION

Technical Problem

The present invention provides a practical technique for producing an electrode industrially from an aluminum porous body. Specifically, an object thereof is to provide a three-dimensional net-like (i.e., a network) aluminum porous body in which the diameter of cells in the porous body is uneven in the thickness direction of the porous body, a current collector and an electrode each using the aluminum porous body, and methods for producing these members.

Solution to Problem

The inventors have made eager investigations about methods for electroplating a surface of a urethane resin porous body having a three-dimensional net-like structure with aluminum to find out that such plating can be attained by plating, with aluminum in a molten salt bath, a urethane resin porous body having at least a surface made electrically conductive. Thus, a method for producing an aluminum porous body has been completed. This production method makes it possible to yield an aluminum structural body having a urethane resin porous body as a skeleton core. Depending on an article in which the resultant porous body is used, such as a filter that may be of various types, or a catalyst carrier, the resultant porous body may be used, as it is, as a complex composed of the resin and the metal. However, when the resultant porous body is to be used as a metallic structural body containing no resin because of a restriction based on the use environment, and others, it is necessary to remove the resin to change the resultant porous body to an aluminum porous body.

The removal of the resin may be attained by using an organic solvent, a molten salt or supercritical water to decompose (dissolve) the resin, by thermally decomposing the resin, or by any other method.

The thermal decomposition method, or some other method at high temperature is simple and easy while the method accompanies the oxidation of aluminum. Once aluminum is oxidized, the metal is not easily reduced, this situation being different from that of nickel or the like. Thus, when aluminum is used as a material for an electrode of a battery or some other member, aluminum is oxidized to lose electroconductivity. Thus, the metal cannot be used. Therefore, as a method for removing a resin in such a manner that the aluminum is not oxidized, the inventors have completed a method in which in the state that an aluminum structural body obtained by forming an aluminum layer on the surface of a porous resin shaped body is immersed in a molten salt, the structural body is heated up to the melting point of aluminum or lower while a negative potential is applied to the aluminum layer, so as to decompose the porous resin shaped body thermally to be removed, thereby producing an aluminum porous body.

In order to use an aluminum porous body obtained as described above as an electrode, it is necessary to attach, through a process as illustrated in FIG. 1, lead wires to the aluminum porous body to prepare a current collector, fill an active material into this aluminum porous body as the current collector, and then subject the workpiece to compression, cutting and some other processing. However, there has not yet been known any technique put into practical use for producing industrially an electrode of a nonaqueous electrolyte battery, a capacitor wherein a nonaqueous electrolyte is used, or some other article from the aluminum porous body.

The present invention is as follows:

(1) A three-dimensional net-like aluminum porous body in a sheet form, for a current collector, wherein the diameter of cells in the porous body is uneven in the thickness direction of the porous body.

(2) The three-dimensional net-like aluminum porous body according to item (1), wherein when a cross section in the thickness direction of the porous body is divided into three regions of a region 1, a region 2 and a region 3 in this order, the average cell diameter of the cell diameter of the region 1 and that of the region 3 is different from the cell diameter of the region 2.

(3) The three-dimensional net-like aluminum porous body according to item (2), wherein the ratio of the average cell diameter of the cell diameter of the region 1 and that of the region 3 to the cell diameter of the region 2 is 1.1 or more.

(4) The three-dimensional net-like aluminum porous body according to item (2), wherein the ratio of the average cell diameter of the cell diameter of the region 1 and that of the region 3 to the cell diameter of the region 2 is 0.9 or less.

(5) The three-dimensional net-like aluminum porous body according to item (1), wherein when a cross section in the thickness direction of the porous body is divided into two regions of a region 4 and a region 5, the ratio of the cell diameter of the region 4 to that of the region 5 is 1.1 or more.

(6) The three-dimensional net-like aluminum porous body according to item (1), wherein three sheet-form aluminum porous bodies A, B and C are laminated in this order onto each other in the respective thickness directions of the porous bodies to be integrated with each other, and the ratio of the average cell diameter of the cell diameter of the aluminum porous body A and that of the aluminum porous body C to the cell diameter of the aluminum porous body B is 1.1 or more.

(7) The three-dimensional net-like aluminum porous body according to item (1), wherein three sheet-form aluminum porous bodies D, E and F are laminated in this order onto each other in the respective thickness directions of the porous bodies to be integrated with each other, and the ratio of the average cell diameter of the cell diameter of the aluminum porous body D and that of the aluminum porous body F to the cell diameter of the aluminum porous body E is 0.9 or less.

(8) The three-dimensional net-like aluminum porous body according to item (1), wherein two sheet-form aluminum porous bodies G and H are laminated in this order onto each other in the respective thickness directions of the porous bodies to be integrated with each other, and the ratio of the cell diameter of the aluminum porous body G to the cell diameter of the aluminum porous body H is 1.1 or more.

(9) The three-dimensional net-like aluminum porous body according to item (1), wherein the oxygen content in a surface of the porous body is 3.1% by mass or less.

(10) The three-dimensional net-like aluminum porous body according to item (1), wherein when the porous body is divided in the thickness direction thereof into a large-cell-diameter region having a large cell diameter and a small-cell-diameter region having a smaller cell diameter than this large cell diameter, the cell diameter of the large-cell-diameter region is 300 μm or more and 600 μm or less.

(11) The three-dimensional net-like aluminum porous body according to item (1), wherein when the porous body is divided in the thickness direction thereof into a large-cell-diameter region having a large cell diameter and a small-cell-diameter region having a smaller cell diameter than this large cell diameter, the cell diameter of the small-cell-diameter region is 50 μm or more and 300 μm or less.

(12) The three-dimensional net-like aluminum porous body according to item (1), wherein when the porous body is divided in the thickness direction thereof into a large-cell-diameter region having a large cell diameter and a small-cell-diameter region having a smaller cell diameter than this large cell diameter, the cell diameter of the small-cell-diameter region is less than 750 μm.

(13) An electrode wherein the three-dimensional net-like aluminum porous body as recited in any one of items (1) to (12) is used.

(14) A nonaqueous electrolyte battery wherein the electrode as recited in item (13) is used.

(15) A capacitor using a nonaqueous electrolyte wherein the electrode as recited in item (13) is used.

Advantageous Effects of Invention

The three-dimensional net-like aluminum porous body according to the present invention can be used in a process for producing electrode materials continuously, and makes it possible to lower industrial costs for the production.

When the three-dimensional net-like aluminum porous body of the present invention is used as a base of an electrode, the porous body can make improvements of the electrode in current collecting performance of a central region in the thickness direction thereof and in availability ratio of the active material inside the electrode. Furthermore, the porous body can make improvements of the electrode in holding performance of the active material, battery lifespan, and windability.

DESCRIPTION OF EMBODIMENTS

The three-dimensional net-like aluminum porous body according to the present invention is a three-dimensional net-like aluminum porous body in a sheet form, for a current collector, wherein the diameter of cells in the porous body is uneven in the thickness direction of the porous body. In the present invention, it is preferred that when a cross section in the thickness direction of the three-dimensional net-like aluminum porous body is divided into three regions of a region 1, a region 2 and a region 3 in this order, the average of the cell diameters of the region 1 and the region 3 is different from the cell diameter of the region 2.

In the present invention, the cell diameter (pore diameter) of each of the regions in the cross section in the thickness direction of the aluminum porous body may be measured as follows:

A resin is first filled into portions of openings in the three-dimensional net-like aluminum porous body. Examples of the filled resin include an epoxy resin, an acrylic resin, and a polyester resin. After the resin is solidified, the porous body is polished to create a cross section thereof. The cross section is observed with a microscope, and a photograph thereof is taken. Subsequently, the photograph is divided into three regions in the thickness direction of the aluminum porous body. The regions are in turn named the region 1, the region 2 and the region 3. The total number of skeleton ribs (i.e., the total number of aluminum portions) contained in each of the regions in the photograph is counted. This measurement is made about each of five different cross sections, and the average thereof is calculated out.

The reciprocal of this number of the skeleton ribs is in proportion to the cell diameter; thus, in the present invention, a discussion will be made by use of the reciprocal of the number of the skeleton ribs.

Figure 2:
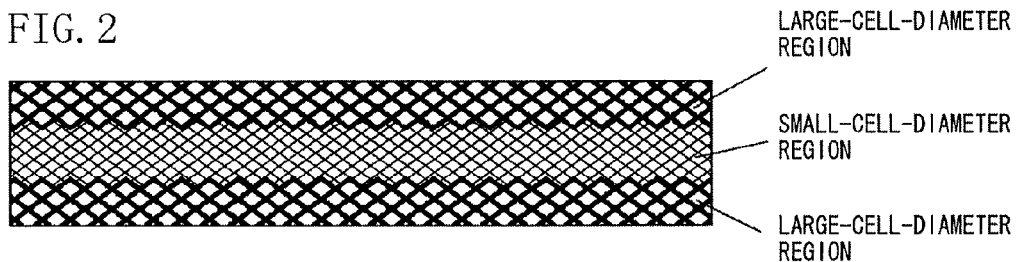
FIG. 2 is a schematic sectional view illustrating an aluminum porous body wherein an inner region (central region) is smaller in cell diameter than outer surface regions (the front and rear surfaces).
Figure 3:
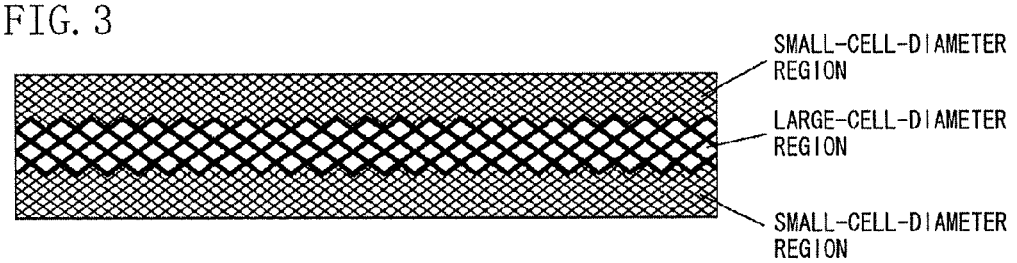
FIG. 3 is a schematic sectional view illustrating an aluminum porous body wherein outer surface regions (the front and rear surfaces) are smaller in cell diameter than an inner region (central region).

As described above, the three-dimensional net-like aluminum porous body of the present invention is characterized in that the cell diameter (pore diameter) is uneven in the thickness direction. It can be conceived that the three-dimensional net-like aluminum porous body having this structure is classified into, for example, the following three embodiments [1] to [3];

[1] As illustrated in FIG. 2, an embodiment wherein an inner region (the central region) of the sheet-form aluminum porous body is made small in cell diameter, and outer surface regions (the front surface and the rear surface) thereof are made large in cell diameter;

[2] As illustrated in FIG. 3, an embodiment wherein outer surface regions (the front surface and the rear surface) of the sheet-form aluminum porous body are made small in cell diameter, and an inner region (the central region) thereof is made large in cell diameter; and

Figure 4:
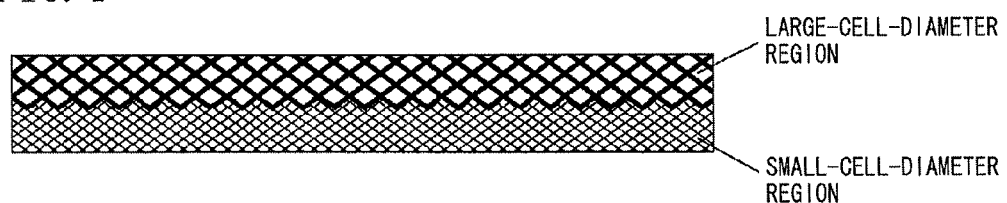
FIG. 4 is a schematic sectional view illustrating an aluminum porous body wherein one of both half sides in the thickness direction is larger in cell diameter than the other half side.

[3] As illustrated in FIG. 4, an embodiment wherein one of both half sides in the thickness direction of the sheet-form aluminum porous body is made smaller in cell diameter than the other half side.

The following will describe a specific configuration of each of the embodiments [1] to [3], and effects thereof.

Re: Embodiment [1]

When an aluminum porous body is used as the base of an electrode of a nonaqueous electrolyte battery (such as a lithium battery), a capacitor wherein a nonaqueous electrolyte is used, or some other article, in a region of the porous body where the diameter of cells is small, the distance between the active material and the skeleton is small. Therefore, in the case of using, as the base of an electrode, a three-dimensional net-like aluminum porous body of the embodiment [1] as illustrated in FIG. 2, the electrode is improved in current collecting performance and availability ratio of the active material inside a central region in the thickness direction thereof. Thus, the provided electrode can be an electrode excellent in power characteristic.

For this reason, in the three-dimensional net-like aluminum porous body of the present invention, the ratio of the average of the cell diameters of the region 1 and the region 3 to the cell diameter of the region 2 is preferably 1.1 or more, more preferably 1.5 or more. If the ratio of the average cell diameter of the regions 1 and 3 to the cell diameter of the region 2 is less than 1.1, it is difficult for the porous body to obtain the above-mentioned effects of the improvements in current collecting performance and availability ratio of the active material of the central region in the thickness direction.

As described above, this ratio between the cell diameters is obtained by counting the number of the skeleton ribs from a microscopic photograph of each of the regions, gaining the respective reciprocals of the resultant numbers, and calculating the ratio between these numerical values. In other words, a calculation is made about the average of the reciprocal value of the number of the skeleton ribs of the region 1 (hereinafter, the reciprocal value of the number of skeleton ribs may be referred to merely as the reciprocal value) and the reciprocal value of the region 3, and then this is divided by the reciprocal value of the region 2.

In order to produce an aluminum porous body wherein the ratio of the average of the cell diameters of the regions 1 and 3 to the cell diameter of the region 2 is 1.1 or more as described above, a polyurethane foam as described in the following is used in an aluminum porous body-producing process which will be described later. That is, in the step of foaming a polyurethane, at the time of foaming a foaming raw material thereof continuously in a sheet-form mold, the upper and lower planes of the mold are warmed to 50° C. or higher, whereby the growth of cells in the upper and lower planes of the sheet is promoted to give a urethane sheet having a desired cell diameter distribution in the thickness direction thereof. This urethane sheet is plated with aluminum, and the urethane is removed to yield the aluminum porous body, wherein the ratio of the average of the cell diameters of the regions 1 and 3 to the cell diameter of the region 2 is 1.1 or more.

Aluminum porous bodies different from each other in cell diameter are laminated onto each other, whereby the same effects can be produced. In other words, the three-dimensional net-like aluminum porous body of the present invention is preferably a three-dimensional net-like aluminum porous body wherein three sheet-form aluminum porous bodies A, B and C are laminated in this order onto each other in the respective thickness directions of the porous bodies to be integrated with each other, and the ratio of the average cell diameter of the aluminum porous bodies A and C to the cell diameter of the aluminum porous body B is 1.1 or more.

Figure 5:
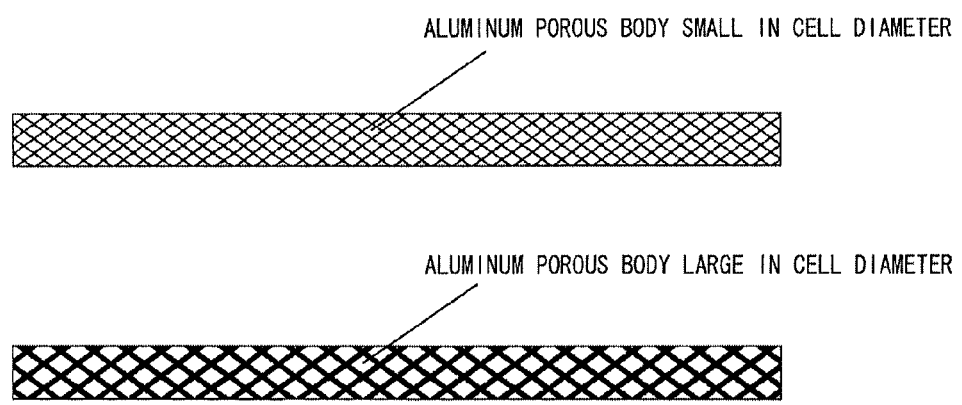
FIG. 5 is a schematic sectional view illustrating two types of aluminum porous bodies having different cell diameters.

Specifically, as illustrated in FIG. 5, prepared are two aluminum porous body species, i.e., aluminum porous bodies small in cell diameter, and aluminum porous bodies large in cell diameter. One B of the aluminum porous bodies small in cell diameter is sandwiched between two A and C of the aluminum porous bodies large in cell diameter so that the aluminum porous bodies are laminated onto each other to be integrated with each other. This manner makes it possible to produce a three-dimensional net-like aluminum porous body wherein outer surface layer regions (the front surface and the rear surface) are large in cell diameter, and in reverse an inner region (the central layer region) is small in cell diameter. The lamination and integration of the plural aluminum porous bodies makes it possible to make the three-dimensional net-like aluminum porous body larger in thickness than ones in the prior art.

Additionally, the aluminum porous bodies A to C are selected to set, to 1.1 or more, the ratio of the average cell diameter of the cell diameter of the aluminum porous body A and that of the aluminum porous body C to the cell diameter of the aluminum porous body B, thereby making it possible to improve the current collecting performance of the central region in the thickness direction of the resultant aluminum porous body, and further improve the availability ratio of the active material. The ratio of the average cell diameter of the aluminum porous bodies A and C to the cell diameter of the aluminum porous body B is more preferably 1.5 or more.

The manner for integrating the laminated aluminum porous bodies A to C is not particularly limited. For example, the temperature of the laminated aluminum porous body sheets is raised up to a temperature close to the melting point of aluminum in the state that pressure is applied to the laminated sheets, whereby their skeletons contacting with each other are melted to be bonded to each other so that the integration can be attained. Alternatively, the integration may be attained by bonding surfaces of the laminated aluminum porous bodies to each other by welding such as spot welding.

Re: Embodiment [2]

As described above, when an aluminum porous body is used as the base of an electrode of a nonaqueous electrolyte battery (such as a lithium battery), a capacitor wherein a nonaqueous electrolyte is used, or some other article, in a region of the porous body where the diameter of cells is small, the distance between the active material and the skeleton is small; thus, the electrode can be improved in current collecting performance and availability ratio of the active material. Moreover, the region where the cell diameter is small generally has an effect that in the region, the filled active material drops away less easily than in regions where the cell diameter is large. Furthermore, when the aluminum porous body has undergone the step F (compressing step) in the electrode-producing process illustrated in FIG. 1, in the region where the cell diameter is small, stronger adhesion is attained between the active material and the skeleton so that the region is improved in holding performance of the active material.

Therefore, in the case of using, as the base of an electrode, a three-dimensional net-like aluminum porous body of the embodiment [2] as illustrated in FIG. 3, in outer surface regions of the aluminum porous body, the active material adheres strongly to the skeleton. Thus, the porous body produces an effect of being made better in holding performance of the active material. In other words, the active material is prevented from dropping away so that the battery is improved in lifespan and power characteristic.

For this reason, in the three-dimensional net-like aluminum porous body of the present invention, the ratio of the average cell diameter of the cell diameter of the region 1 and that of the region 3 to the cell diameter of the region 2 is preferably 0.9 or less, more preferably 0.7 or less. If the ratio of the average cell diameter of the regions 1 and 3 to the cell diameter of the region 2 is more than 0.9, it is difficult that the porous body produces the above-mentioned effect that the porous body is improved in holding performance of the active material.

As described above, this ratio between the cell diameters is obtained by counting the number of the skeleton ribs from a microscopic photograph of each of the regions as described above, gaining the respective reciprocals of the resultant numbers, and calculating the ratio between these numerical values. In other words, a calculation is made about the average of the reciprocal value of the region 1 and that of the region 3, and then this is divided by the reciprocal value of the region 2.

An aluminum porous body wherein the ratio of the average cell diameter of the cell diameter of the region 1 and that of the region 3 to the cell diameter of the region 2 is 0.9 or less as described above may be produced by use of a polyurethane foam as described in the following in the aluminum porous body-producing process which will be described later. That is, in the step of foaming a polyurethane, at the time of foaming a foaming raw material thereof continuously in a sheet-form mold, the upper and lower planes of the mold are cooled to 5° C. or lower, whereby the growth of cells in the upper and lower planes of the sheet is restrained to give a urethane sheet having a desired cell diameter distribution in the thickness direction thereof. This urethane sheet is plated with aluminum, and the urethane is removed to yield the aluminum porous body, wherein the ratio of the average cell diameter of the cell diameter of the region 1 and that of the region 3 to the cell diameter of the region 2 is 0.9 or less.

Similarly to the above-mentioned case, it is effective that aluminum porous bodies different from each other in cell diameter are laminated onto each other. In other words, the three-dimensional net-like aluminum porous body of the present invention is preferably a three-dimensional net-like aluminum porous body wherein three sheet-form aluminum porous bodies D, E and F are laminated in this order onto each other in the respective thickness directions of the porous bodies to be integrated with each other, and the ratio of the average cell diameter of the aluminum porous bodies D and F to the cell diameter of the aluminum porous body E is 0.9 or less.

In this case, the aluminum porous body E, which is large in cell diameter, is sandwiched between the two aluminum porous bodies D and F, which are small in cell diameter, so that the aluminum porous bodies are laminated onto each other to be integrated with each other. This manner makes it possible to produce a three-dimensional net-like aluminum porous body wherein outer surface layer regions (the front surface and the rear surface) are small in cell diameter, and in reverse an inner region (the central layer region) is large in cell diameter. The lamination and integration of the plural aluminum porous bodies makes it possible to make the three-dimensional net-like aluminum porous body larger in thickness than ones in the prior art.

The aluminum porous bodies D to F are selected to set, to 0.9 or less, the ratio of the average cell diameter of the cell diameter of the aluminum porous body D and that of the aluminum porous body F to the cell diameter of the aluminum porous body E, thereby making it possible to improve the resultant aluminum porous body in holding performance of an active material therein, and improve the lifespan of the battery. The ratio of the average cell diameter of the aluminum porous bodies D and F to the cell diameter of the aluminum porous body E is more preferably 0.7 or less.

The manner for integrating the laminated aluminum porous bodies D to F is not particularly limited. For example, the temperature of the laminated aluminum porous body sheets is raised up to a temperature close to the melting point of aluminum in the state that pressure is applied to the laminated sheets, whereby their skeletons contacting with each other are melted to be bonded to each other so that the integration can be attained. Alternatively, the integration may be attained by bonding surfaces of the laminated aluminum porous bodies to each other by welding such as spot welding.

Re: Embodiment [3]

In the case of bending a sheet-form aluminum porous body to be worked into, for example, a cylindrical form, the vicinity of the surface region which is to be the outside of the cylinder is stretched and in reverse a compressing force is applied to the vicinity of the surface region which is to be the inside at the time of the bending. Accordingly, in the case of bending, as an aluminum porous body, an aluminum porous body as illustrated in FIG. 4, wherein the cell diameter of a region that is to be the outside when the body is bent is adjusted to be made large and further the cell diameter of a region which is to be the inside is adjusted to be made small, the bend-working is easily performed. Thus, an electrode is improved in windability. In other words, usually, by bend-working, skeleton ribs positioned at the outside of an electrode plate are partially cut with ease. When the ribs are cut, the cut portions break through the separator, so that short circuit is caused. Thus, in the case of bend-working an aluminum porous body wherein the cell diameter of a region which is to be the outside when the body is bent is adjusted to be large, and that of a region which is to be inside is adjusted to be small, the skeleton ribs in the outside region having the large cell diameter are not easily cut since the outside region is large in displacement quantity permitting the skeleton ribs to be deformed and finally broken. As a result, the aluminum porous body is easily bend-worked so that the electrode is improved in windability.

When a cross section in the thickness direction of the three-dimensional net-like aluminum porous body of the present invention is divided into two regions of a region 4 and a region 5, the ratio of the cell diameter of the region 4 to that of the region 5 is preferably 1.1 or more, more preferably 1.5 or more. If the ratio of the cell diameter of the region 4 to that of the region 5 is less than 1.1, the above-mentioned effect that the windability is excellent is not easily obtained.

In order to produce an aluminum porous body wherein the ratio of the cell diameter of the region 4 to that of the region 5 is 1.1 or more as described above, a polyurethane foam as described in the following is used in the aluminum porous body-producing process which will be described later. That is, in the step of foaming a polyurethane, at the time of foaming a foaming raw material thereof continuously in a sheet-form mold, the upper surface of the mold is warmed to 50° C. or higher, or the lower surface is cooled to 5° C. or lower, whereby the growth of cells in the upper surface of the sheet is promoted while the growth of cells in the lower surface is restrained to give a urethane sheet having a desired cell diameter distribution in the thickness direction thereof. This urethane sheet is plated with aluminum, and the urethane is removed to yield the aluminum porous body, wherein the ratio of the cell diameter of the region 4 to that of the region 5 is 1.1 or more.

Similarly to the above-mentioned case, it is effective that aluminum porous bodies different from each other in cell diameter are laminated onto each other. In other words, the three-dimensional net-like aluminum porous body of the present invention is preferably a three-dimensional net-like aluminum porous body wherein two sheet-form aluminum porous bodies G and H are laminated in this order onto each other in the respective thickness directions of the porous bodies to be integrated with each other, and the ratio of the cell diameter of the aluminum porous body G to that of the aluminum porous body H is 1.1 or more.

The aluminum porous body H small in cell diameter and the aluminum porous body G large in cell diameter are laminated onto each other to be integrated with each other, thereby making it possible to produce a three-dimensional net-like aluminum porous body in which the diameter of cells in the porous body is uneven in the thickness direction. Moreover, the lamination and integration of the plural aluminum porous bodies makes it possible to make the three-dimensional net-like aluminum porous body larger in thickness than ones in the prior art.

The aluminum porous bodies G and H are selected to set, to 1.1 or more, the ratio of the cell diameter of the aluminum porous body G to that of the aluminum porous body H, thereby making it possible to yield an aluminum porous body excellent in bending workability. The ratio of the cell diameter of the aluminum porous body G to that of the aluminum porous body H is more preferably 1.5 or more.

The manner for integrating the laminated aluminum porous bodies G and H is not particularly limited. For example, the temperature of the laminated aluminum porous body sheets is raised up to a temperature close to the melting point of aluminum in the state that pressure is applied to the laminated sheets, whereby their skeletons contacting with each other are melted to be bonded to each other so that the integration can be attained. Alternatively, the integration may be attained by bonding surfaces of the laminated aluminum porous bodies to each other by welding such as spot welding.

The three-dimensional net-like aluminum porous body of the present invention has a large-cell-diameter region having a large cell diameter and a small-cell-diameter region having a smaller cell diameter than this large cell diameter, as seen in the embodiments [1] to [3]. For example, the following are each the large-cell-diameter region: the regions 1 and 3 in the embodiment [1], as well as the outer surface layer regions (the regions originating from the aluminum porous bodies A and C) therein; the region 2 in the embodiment [2], as well as the inner region (the region originating from the aluminum porous body E) therein; and the region 4 in the embodiment [3], as well as the region originating from the aluminum porous body G therein. Contrarily, for example, the following are each the small-cell-diameter region: the region 2 in the embodiment [1], as well as the inner region (the region originating from the aluminum porous body B) therein; the regions 1 and 3 in the embodiment [2], as well as the outer surface layer regions (the regions originating from the aluminum porous bodies D and F) therein; and the region 5 in the embodiment [3], as well as the region originating from the aluminum porous body H therein.

When the three-dimensional net-like aluminum porous body of the present invention is divided into large-cell-diameter region(s) each having a large cell diameter and small-cell-diameter region(s) each having a smaller cell diameter than this large cell diameter, the cell diameter of the large-cell-diameter region(s) is preferably 300 μm or more and 600 μm or less. This makes it easy that the porous body certainly keeps, for example, active-material-filling performance and organic-electrolytic-solution-permeability. On the other hand, in the three-dimensional net-like aluminum porous body of the present invention, the cell diameter of the small-cell-diameter region(s) is preferably 50 μm or more and 300 μm or less. This makes it possible to obtain, for example, an effect of improving the availability ratio of the active material. More preferably, the cell diameter of the large-cell-diameter region(s) is 300 μm or more and 600 μm or less, and that of the small-cell-diameter region(s) is 50 μm or more and 300 μm or less. Additionally, the cell diameter of the large-cell-diameter region(s) is preferably 400 μm or more and 500 μm or less, and that of the small-cell-diameter region(s) is preferably 100 μm or more and 200 μm or less.

Furthermore, in the three-dimensional net-like aluminum porous body of the present invention, the thickness of the small-cell-diameter region(s) is preferably less than 750 μm. If the small-cell-diameter region(s) is/are too thick, the active-material-filling performance and the organic-electrolytic-solution-permeability in the small-cell-diameter region(s) may deteriorate. Thus, the thickness of the small-cell-diameter region(s) may set to, for example, less than 750 μm. The thickness of the whole of the aluminum porous body may be set to, for example, 800 μm or more. The thickness referred to herein is a value obtained after an active material is filled into the aluminum porous body. Even when this is further subjected to pressure forming, the thickness is a value before the pressure forming.

Hereinafter, a description will be made about a method for producing a three-dimensional net-like aluminum porous body according to the present invention. Referring appropriately to the drawings, the following will describe, as a typical example, an example wherein an aluminum plating method is used as a method for forming an aluminum film on the surface of a urethane resin porous body. In the drawings referred to hereinafter, parts or portions to which the same reference number is attached are the same parts or portions, or parts or portions corresponding thereto. The present invention is not limited to this, and is specified by the claims. The present invention is intended to include all variations that have meanings equivalent to the meaning of the claims and are embraced in a scope equivalent to the scope of the claims.

(Process for Producing Aluminum Structural Body)

Figure 6:
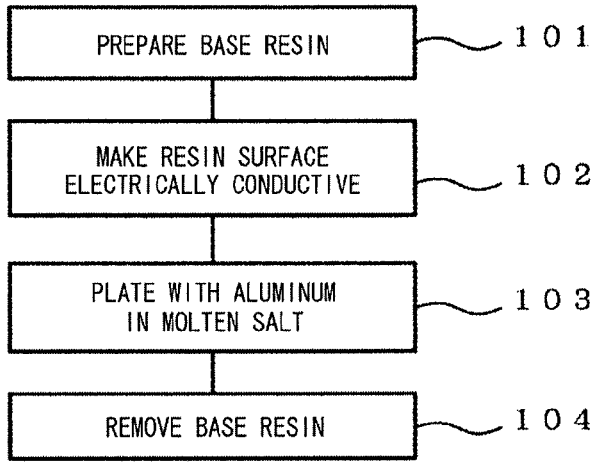
FIG. 6 is a flowchart showing a process for producing an aluminum structural body according to the present invention.
Figure 7A:
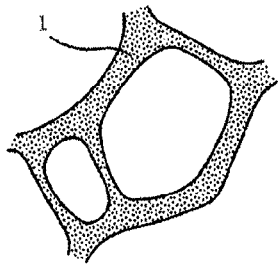
FIG. 7 is a schematic sectional view referred to in order to describe the process for producing the aluminum structural body according to the present invention.
Figure 7B:
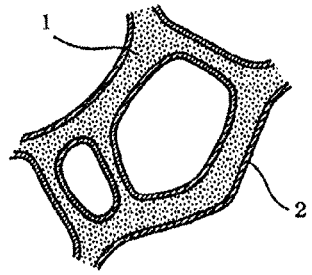

FIG. 6 is a flowchart showing a process for producing an aluminum structural body. Correspondingly to the flowchart, FIGS. 7(a) to 7(d) are each a view that schematically illustrates a situation that an aluminum plating film is formed onto a resin porous body as a core member. With reference to FIG. 6 and FIGS. 7(a) to 7(d), a description is herein made about the progress of the whole of the production process. First, a resin porous body base is prepared [101]. FIG. 7(a) is an enlarged schematic view of an example of the resin porous body base wherein a surface of the resin porous body having continuous pores is enlarged. In the state that the resin porous body, which is a body 1, is used as a skeleton, the pores are made. Next, the surface of the resin porous body is made electrically conductive [102]. Through this step, a conductive layer 2 made of a conductor is thinly formed on the surface of the resin porous body 1 as shown in FIG. 7(b).

Figure 7C:
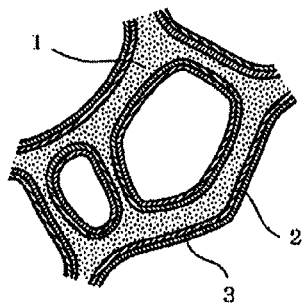

Subsequently, the workpiece is plated with aluminum in a molten salt [103] to form an aluminum plating layer 3 on the surface of the conductive-layer-formed resin porous body (FIG. 7(c)). In this way, an aluminum structural body is yielded wherein the aluminum plating layer 3 is formed on the surface of the resin porous body base as a base. About the resin porous body base, the resin porous body base is removed [104].

Figure 7D:
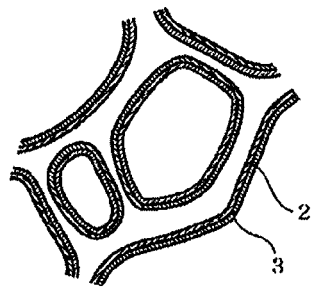

The resin foam porous body 1 is removed by decomposition or the like, so that the aluminum structural body (porous body) in which only the metal layer remains can be yielded (FIG. 7(d)). Hereinafter, each of the steps will be described in turn.

(Preparation of Porous Resin Shaped Body)

Prepared is a porous resin shaped body having a three-dimensional net-like structure and having continuous pores. About the raw material of the porous resin shaped body, any resin may be selected. An example of the raw material is a resin foam shaped body of polyurethane, melamine, polypropylene, or polyethylene. Herein, the wording "resin foam shaped body" is used; however, a resin shaped body having any shape may be selected as far as the body has pores continued to each other (continuous pores). Instead of the resin foam shaped body, for example, a body obtained by entangling resin fibers with each other into a form like a nonwoven fabric may be used. The porosity and the pore diameter (cell diameter) of the resin foam shaped body are preferably set into the range of 80 to 98% and that of 50 to 500 μm, respectively. Each of urethane foam and melamine foam can be preferably used for the resin foam shaped body since these foams have a high porosity, pore continuity, and excellent thermal decomposability.

Urethane foam is preferred because of uniformity of pores therein, high availability, and others. Melamine foam is preferred since the foam gives a shaped body small in pore diameter.

Figure 8:
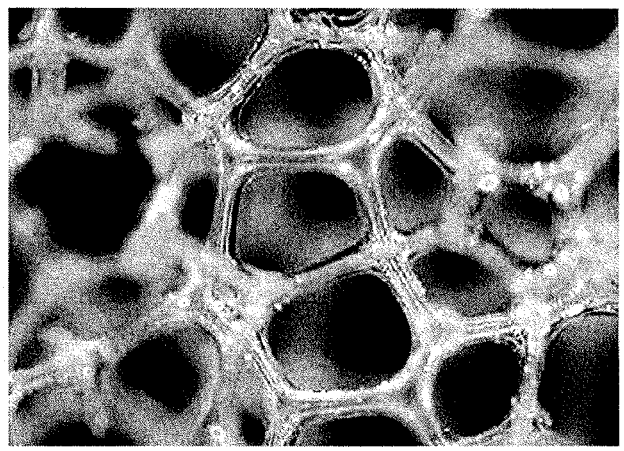
FIG. 8 is a surface enlarged photograph showing the structure of a urethane resin porous body.

In many cases, the porous resin shaped body contains residues of a foaming agent, an unreacted monomer, and others in the step of producing the foamed body; thus, it is preferred for subsequent steps to subject the shaped body to a washing treatment. FIG. 8 shows, as an example of the porous resin shaped body, a urethane foam subjected to a washing treatment as a pre-treatment. The resin shaped body functions as a skeleton to constitute a three-dimensional net, whereby pores continued to each other in the whole are made. Ribs of the skeleton of the urethane foam are made into a substantially triangular form in any cross section perpendicular to the direction in which the ribs are extended. The porosity is defined by the following equation:

Porosity=(1−(the mass [g] of the porous material)/(the volume [cm$^3$] of the porous material×the density of the raw material)×100

The pore diameter (cell diameter) is obtained by enlarging the surface of the resin shaped body through a microscopic photograph, counting the number of pores therein per inch (25.4 mm), as the number of cells, and then calculating a mean value as a value from the following: the average pore diameter=25.4 mm/the number of the cells.

(Surface of Resin Porous Body Made Electrically Conductive)

In order to electroplate the workpiece, the surface of the resin foam is beforehand subjected to an electrically conduction treatment. The treatment is not particularly limited as far as it is a treatment capable of forming a layer having electroconductivity onto the surface of the resin porous body. Any method may be selected, examples of which include electroless plating with a conductive metal such as nickel, vapor deposition and sputtering of aluminum or some other, and coating with a conductive paint containing conductive particles of carbon or some other.

(Formation of Aluminum Layer onto Surface of Resin Porous Body)

Examples of a method for forming an aluminum layer onto the surface of the resin porous body include (i) vapor deposition methods (such as a vacuum vapor deposition, a sputtering method, and a laser ablation method), (ii) a plating method, and (iii) a paste painting method. It is preferred to use, out of these methods, a molten salt plating method as a method suitable for mass production. Hereinafter, the molten salt plating method will be described in detail.

—Molten Salt Plating—

Electroplating is conducted in a molten salt to form an aluminum plating layer on the surface of the resin porous body.

When plating with aluminum is conducted in a molten salt bath, a uniformly thick aluminum layer can be formed on the surface of a complicated skeleton structure, in particular, that of a resin porous body having a three-dimensional net-like structure.

The resin porous body, the surface of which has been made electrically conductive, is used as a negative electrode, and an aluminum piece is used as a positive electrode. In this state, a direct current is applied into the molten salt.

The molten salt may be an organic molten salt that is a eutectic salt composed of an organic halide and an aluminum halide or an inorganic molten salt that is a eutectic salt composed of a halide of an alkali metal and an aluminum halide. It is preferred to use an organic molten salt bath that is molten at a relatively low temperature since the resin porous body as a base can be plated without being decomposed. The organic halide may be an imidazolium salt, a pyridinium salt or some other. Specifically, the halide is preferably 1-ethyl-3-methylimidazolium chloride (EMIC), or butylpyridinium chloride (BPC).

When water or oxygen is incorporated into the molten salt, the molten salt is deteriorated. It is therefore preferred to conduct the plating under the atmosphere of an inert gas such as nitrogen or argon in a closed environment.

The molten salt bath is preferably a molten salt bath containing nitrogen, in particular, an imidazolium salt bath. When a salt that is molten at high temperature is used as a molten salt, the dissolution or decomposition of the resin into the molten salt becomes speedier than the growth of a plating layer, so that no plating layer can be formed on the resin porous body surface. The imidazolium salt bath can be used without affecting the resin even at a relatively low temperature. The imidazolium salt is preferably a salt containing an imidazolium cation having alkyl groups at the 1 and 3 positions thereof, and is most preferably an aluminum chloride-1-ethyl-3-methylimidazolium chloride (AlCl$_3$-EMIC) type molten salt since the salt is high in stability and is not easily decomposed. The temperature of the molten salt bath is 10 to 100° C., preferably 25 to 45° C. since a urethane resin foam, a melamine resin foam or some other can be plated. As the temperature is lower, the range of current densities making plating possible is narrower so that the whole of the porous body surface is less easily plated. At a high temperature over 100° C., there is easily generated an inconvenience that the shape of the resin base is damaged.

It is reported to add, to AlCl$_3$-EMIC, an additive such as xylene, benzene, toluene, or 1,10-phenanthroline. The inventors have found out that the addition of 1,10-phenanthroline can give an effect especial for the formation of an aluminum porous body, in particular, when plating with aluminum is applied to a resin porous body having a three-dimensional net-like structure. In other words, the addition gives a first characteristic that the aluminum skeleton that forms the porous body is not easily broken, and a second characteristic that the porous body can be evenly plated to give a small difference in thickness between the plating on the surface region of the porous body and that on the inside thereof.

In a case where the aluminum porous body is pressed when finished, or in some other case, the two characteristics of the high breaking resistance and the uniformity of the plating thickness on the outside and the inside make it possible to yield a pressed porous body where the whole of the skeleton is not easily broken and the pressing has been evenly attained. When any aluminum porous body is used as an electrode material for a battery or some other, an electrode active material is filled into the electrode and then the electrode is pressed to make the density thereof high; in the step of filling the active material or pressing the electrode, the skeleton is easily broken. Thus, for such a usage, the porous body of the present invention is very useful.

From the above-mentioned matters, it is preferred to add an organic solvent to the molten salt bath. 1,10-Phenanthroline is in particular preferably used. The amount thereof to be added to the plating bath is preferably 0.25 to 7 g/L. If the amount is 0.25 g/L or less, a plating layer brittle and poor in flatness and smoothness is obtained and further the effect of decreasing the difference between the thickness on the surface layer and that on the inside is not easily obtained. If the amount is 7 g/L or more, the plating efficiency is declined so that a predetermined plating thickness is not easily obtained.

Figure 9:
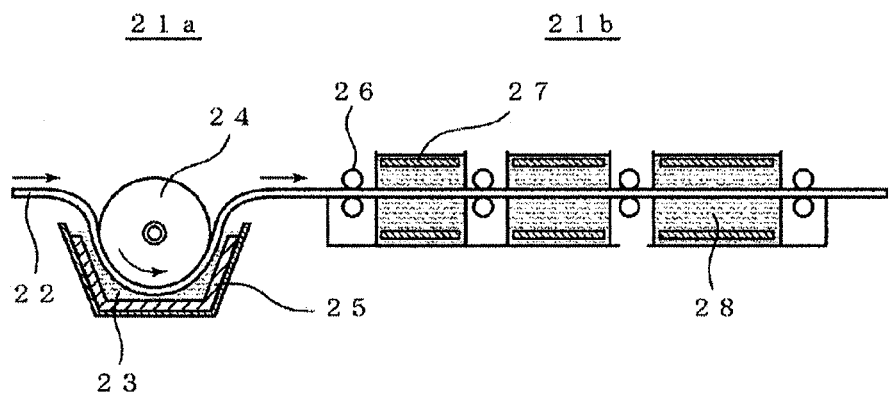
FIG. 9 is a view illustrating an example of a continuous aluminum plating step according to plating with a molten salt.

FIG. 9 is a view that schematically illustrates the structure of an apparatus for plating band-form resin continuously with aluminum. Illustrated is a mechanics for feeding a band-form resin 22, having the surface made electrically conductive, from the left in this drawing to the right. A first plating tank 21a is composed of a cylindrical electrode 24, a positive electrode 25 set to an inner wall of a container and made of aluminum, and a plating bath 23. The band-form resin 22 is passed in the plating bath 23 along the cylindrical electrode 24, whereby electric current easily flows evenly into the whole of the resin porous body so that even plating can be obtained. Plating tanks 21b are tanks for depositing plating layers thickly and evenly, and are formed to repeat plating in the plural tanks. While the band-form resin 22, the surface of which has been made electrically conductive, is successively fed by means of feeding rollers and electrode rollers 26 functioning also as out-of-tank electricity-sending negative electrodes, the resin 22 is passed through plating baths 28 to plate the resin. In the tanks, positive electrodes 27 made of aluminum are fitted to both surfaces of the resin porous body to interpose the plating baths 28 between the porous body and both of the surfaces, so that evener plating layers can be deposited onto both the surfaces of the resin porous body, respectively. Nitrogen is blown onto the plated aluminum porous body to remove the plating liquid sufficiently. The workpiece is then washed with water to yield an aluminum porous body.

In the meantime, an inorganic salt bath may be used for a molten salt as far as the resin is neither dissolved nor damaged in any other manner. The inorganic salt bath is typically a two-component type or multi-component type salt of $AlCl_3$—XCl wherein X is an alkali metal. Such an inorganic salt bath is generally higher in melting temperature than organic salt baths such as an imidazolium salt bath; however, the inorganic salt bath is less restricted by environment factors such as water and oxygen, so that the salt can be put into practical use at low costs as a whole. When the resin is a foamed melamine resin, the resin can be used at a higher temperature than any foamed urethane resin. Thus, an inorganic salt bath of 60 to 150° C. temperature is used.

The other methods, i.e., the vapor deposition methods (i) and the paste painting method (iii) will be described.

—Gas Phase Methods—

In a vacuum vapor deposition, for example, an electron beam is radiated onto aluminum as a raw material to melt and vaporize aluminum to deposit the aluminum onto the surface of the resin porous body, whereby an aluminum layer can be formed. In a sputtering method, for example, plasma is radiated onto an aluminum target to gasify the aluminum so as to be deposited onto the surface of the resin porous body, whereby an aluminum layer can be formed. In a laser ablation method, for example, aluminum is molten and vaporized by irradiation with a laser to deposit aluminum onto the surface of the resin porous body, whereby an aluminum layer can be formed.

—Paste Painting Method—

In the paste painting method, use is made of, for example, an aluminum paste wherein an aluminum powder, a binder, and an organic solvent are mixed with each other. The aluminum paste is painted onto the resin porous body surface, and then heated to remove the binder and the organic solvent and further sinter the aluminum paste. The sintering may be performed once, or may be dividedly performed plural times. For example, by painting the aluminum paste, heating the resin body at low temperature to remove the organic solvent, and then heating the resin porous body in the state of being immersed in a molten salt, the resin can be thermally decomposed and simultaneously the aluminum paste can be sintered. The sintering is preferably performed in a non-oxidizing atmosphere.

Through the above-mentioned steps, obtained is an aluminum structural body having the resin shaped body as the core of its skeleton (aluminum porous body). Depending on the use thereof for a filter that may be of various types, a catalyst carrier, or some other, this resultant aluminum porous body may be used, as it is, as a complex of the resin and the metal. When the resultant is used as a metallic structural body containing no resin in light of a restriction of the environment for the use, the resin may be removed. The removal of the resin may be attained by any method, such as decomposition (dissolution) by use of an organic solvent, a molten salt, or supercritical water, or heating decomposition. Although heating decomposition at high temperature, and the like are simple and easy, the oxidization of aluminum is followed thereby. Once aluminum is oxidized, the metal is not easily reduced, this situation being different from that of nickel or the like. Thus, when aluminum is used as, for example, a material for an electrode of a battery or some other member, aluminum is oxidized to lose electroconductivity. Thus, the metal cannot be used.

Therefore, in order not to oxidize aluminum, it is preferred to use a method of removing the resin by thermal decomposition in a molten salt that will be described below.

(Removal of the Resin: Thermal Decomposition in Molten Salt)

The thermal decomposition in a molten salt is performed by a method described below. The resin shaped body the surface of which has the aluminum plating layer formed is immersed in a molten salt. While a negative potential is applied to the aluminum layer, the resin foam shaped body is heated to be decomposed. The application of the negative potential in the state that the body is immersed in the molten salt makes it possible to decompose the resin foam shaped body without oxidizing the aluminum. The temperature for the heating may be appropriately selected in accordance with the kind of the resin foam shaped body; however, in order not to melt the aluminum, it is necessary to treat the body at the melting point (660° C.) of aluminum, or lower. The temperature is preferably 500° C. or higher and 600° C. or lower. The quantity of the applied negative potential is made into a minus side relative to the reduction potential of aluminum and a plus side relative to the reduction potential of the cation in the molten salt.

The molten salt used for the thermal decomposition of the resin may be a halide salt of an alkali metal or alkaline earth metal which makes the electrode potential of the aluminum lower. Specifically, the salt preferably contains at least one selected from the group consisting of lithium chloride (LiCl), potassium chloride (KCl), sodium chloride (NaCl), and aluminum chloride ($AlCl_3$). Such a method makes it possible to yield an aluminum porous body having continuous pores and having, on the surface thereof, a thin oxide layer so as to be small in oxygen content. Specifically, the oxygen content in the aluminum porous body surface is 3.1% by mass or less. An active material contacts the surface of the aluminum porous body functioning as a current collector so that electrons are donated and received between the porous body and the active material when the battery is charged and discharged; therefore, the nature of the porous body surface affects characteristics of the battery. In the aluminum porous body surface, the oxygen content is 3.1% by mass or less, whereby the oxygen content in the surface is smaller than in aluminum porous bodies in the prior art, so that the electrical resistance of the porous body surface is lower. Thus, this porous body can be expected to improve battery characteristics (in particular, high-rate discharge characteristic). The oxygen content referred to herein is a value obtained by analyzing the aluminum porous body surface quantitatively by EDX (energy dispersive X-ray analysis) at an accelerating voltage of 15 kV. The wording that the oxygen content is 3.1% by mass or less denotes the detection limit according to EDX, or less. A specific description of an analyzing instrument therefor will be made later. Additionally, the aluminum porous body wherein the oxygen content in the surface is 3.1% by mass or less is less easily cracked and more easily deformed when an active material is filled into the porous body and then the resultant is subjected to pressure forming than in conventional aluminum porous bodies having a larger oxygen content in their surface. For this reason, the pressure forming makes it possible to improve electrode density (the filling density of the active material) and improve the adhesiveness between the porous body and the active material while the current collecting performance of the porous body is kept.

The following will describe a process for producing an electrode from the aluminum porous body yielded as described above.

Figure 1:
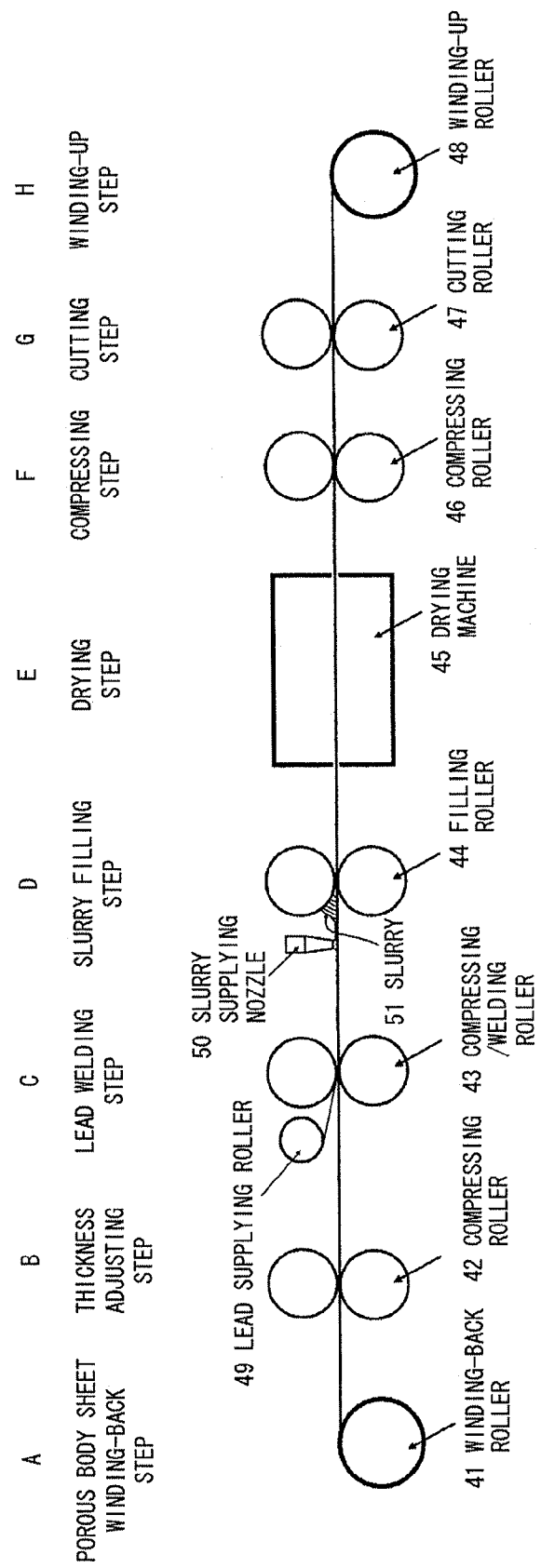
FIG. 1 is a view illustrating a process for producing an electrode material from an aluminum porous body.

FIG. 1 is a view referred to in order to describe an example of a process for producing an electrode continuously from the aluminum porous body.

(Thickness Adjusting Step)

From a raw material roll wherein a sheet of the aluminum porous body is wound, the aluminum porous body sheet is wound back, and the thickness is adjusted into an optimal thickness and further surfaces thereof are made flat and smooth by means of a press machine in a thickness adjusting step. The final thickness of the aluminum porous body is appropriately decided in accordance with the usage of the electrode obtained therefrom. This thickness adjusting step is a compressing step before the porous body is made into the final thickness; thus, the porous body is compressed to such a degree that the body is to have a thickness permitting a processing in the next step to be easily attained. The press machine may be a flat press or a roller press. The flat press is preferred for restraining the current collector from being elongated; however, the press is unsuitable for mass production. Thus, it is preferred to use the roller press, which is capable of attaining a continuous processing.

(Lead Welding Step)

—Compression of End of Aluminum Porous Body—

When the aluminum porous body is used as an electrode current collector of a secondary battery or some other, it is necessary to melt a tab lead for leading-out to the outside, and bond the tab lead onto the aluminum porous body. In the case of an electrode wherein the aluminum porous body is used, the electrode has no strong metallic region. Thus, no lead piece can be directly welded thereto. For this reason, an end of the aluminum porous body is compressed to make the end into a foil piece form. In this manner, mechanical strength is given thereto, and then the tab lead is welded thereto.

A description is made about an example of a method for working the end of the aluminum porous body.

Figure 10:
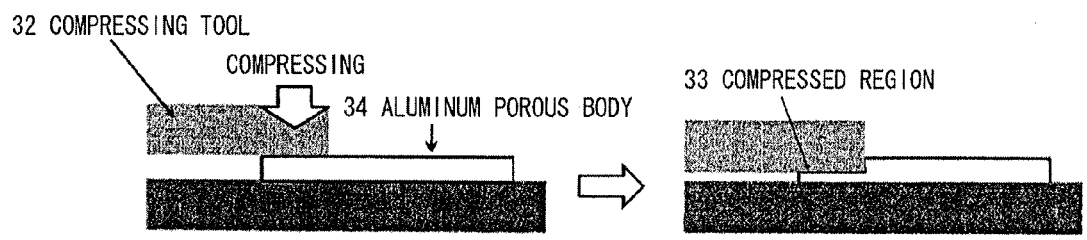
FIG. 10 is a view illustrating the step of compressing an end of an aluminum porous body to form a compressed region.

FIG. 10 is a view that schematically illustrates the compressing step.

A tool for the compression may be a rotatable roller.

The compressed region is made into a thickness of 0.05 mm or more and 0.2 mm or less (for example, about 0.1 mm), whereby the end can gain a predetermined mechanical strength.

Figure 11:
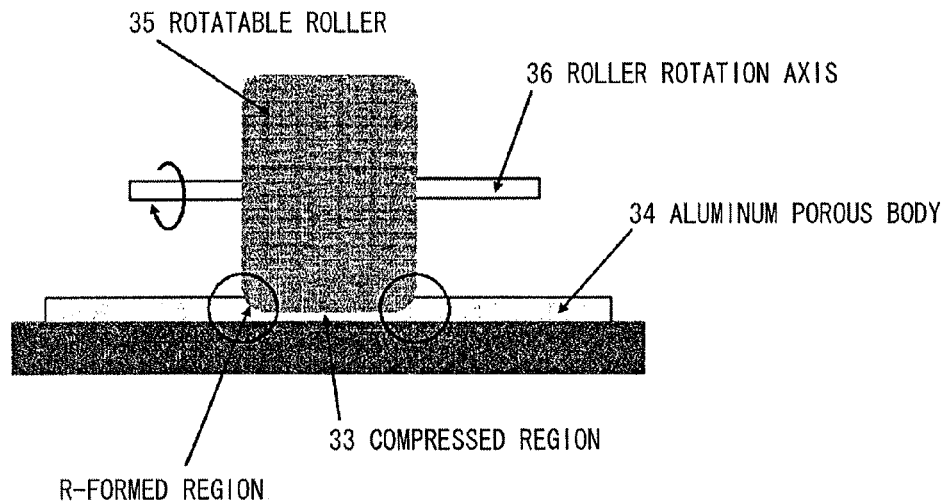
FIG. 11 is a view illustrating the step of compressing a central region of an aluminum porous body to form a compressed region.

In FIG. 11, the center of the aluminum porous body, which is an aluminum porous body 34 having a width corresponding to that of two sheets, is compressed by means of a rotatable roller 35 as the compressing tool to form a compressed region 33. After the compression, the center of the compressed region 33 is cut to yield two electrode current collectors each having, at an end thereof, the compressed region.

A plurality of rotatable rollers may be used to form a plurality of band-form compressed regions in the center of the aluminum porous body, and then each of the band-form compressed regions is cut along the central line thereof, whereby a plurality of current collectors can be yielded.

—Bonding of Tab Lead onto Edge of Electrode—

The tab lead is bonded to the compressed region of the end of the current collector, which has been obtained as described above. It is preferred that the tab lead is a metal foil for decreasing the electrical resistance of the electrode, and the metal foil is bonded to at least one side surface of the edge of the electrode. In order to decrease the electrical resistance, it is preferred to use, as a method for the bonding, welding. If the width of the area onto which the metal foil is to be welded is too large, a useless space is increased in the battery so that the capacity density of the battery is lowered. Thus, the width is preferably 10 mm or less. If the width is too small, the welding becomes difficult and further the power collecting effect is also declined. Thus, the width is preferably 1 mm or more.

The method for the welding may be resistance welding, ultrasonic welding or some other method. Ultrasonic welding is preferred since the method can give a wide bonding area.

—Metal Foil—

The material of the metal foil is preferably aluminum, considering electrical resistance and resistance against electrolytes. If the material contains impurities, the impurities elute out or react in the battery and the capacitor; thus, it is preferred to use an aluminum foil having a purity of 99.99% or more. It is also preferred that the thickness of the welded region is smaller than that of the electrode itself.

The thickness of the aluminum foil is preferably 20 to 500 μm.

The metal foil may be welded before or after an active material is filled into the current collector. When the welding is performed before the filling, the active material is favorably restrained from dropping away. In the case of, in particular, ultrasonic welding, it is preferred to perform the welding before the filling. The active material may adhere onto the welded region. However, the paste may be peeled in the middle of the step; thus, it is preferred to mask it in such a manner that the paste cannot be filled thereinto.

The above has described the end-compressing step, and the tab-lead-bonding step as different steps. However, the compressing step and the bonding step may be simultaneously performed. In this case, the used compressing roller may be a roller wherein a roller region contacting the tab-lead-bonding-end of the aluminum porous body sheet can attain resistance welding. The aluminum porous body sheet and the metal foil are simultaneously supplied to this roller, thereby making it possible to perform the compression of the end and the welding of the metal foil onto the compressed region simultaneously.

(Step of Filling Active Material)

An active material is filled into the current collector yielded as described above to yield an electrode. The active material is appropriately selected in accordance with a use object of the electrode.

For the filling of the active material, a known method, such as an immersion filling method or a coating method, may be used. Examples of the coating method include a roll coating method, an applicator coating method, an electrostatic coating method, a powder coating method, a spray coating method, a spray coater coating method, a bar coater coating method, a roll coater coating method, a dip coater coating method, a doctor blade coating method, a wire bar coating method, a knife coater coating method, and a blade coating method, and screen printing methods.

At the time of filling the active material, a conduction aid and a binder may be added thereto if necessary. Thereinto is incorporated an organic solvent to prepare a slurry, and this slurry is filled into the aluminum porous body by the above-mentioned filling method.

Figure 12:
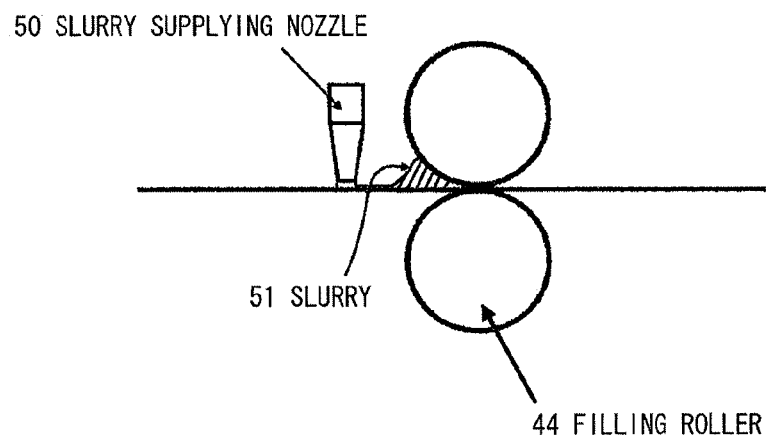
FIG. 12 is a view illustrating the step of filling an active material slurry into pores in an aluminum porous body.

In FIG. 12 is shown a method for filling the slurry into the porous body by a roll coating method. As shown in this drawing, the slurry is supplied onto the porous body sheet, and this is passed through a pair of rotatable rollers that are opposed to each other to have a predetermined gap therebetween. When the sheet is passed through the rotatable rollers, the slurry is pressed and filled into the porous body.

(Drying Step)

The porous body filled with the active material is fed into a drying machine, and heated to evaporate and remove the organic solvent, thereby yielding an electrode material wherein the active material is fixed in the porous body.

(Compressing Step)

The electrode material is dried, and then compressed into a final thickness in a compressing step. The press machine used therefor may be a flat press or a roller press. The flat press is preferred for restraining the current collector from being elongated; however, this press is unsuitable for mass production. Thus, it is preferred to use the roller press, which is capable of attaining a continuous processing.

In a compressing step F in FIG. 1, a case where the electrode material is compressed by a roller press is shown.

(Cutting Step)

In order to improve the mass productivity of electrode material, it is preferred to make the width of the sheet of the aluminum porous body equal to the total width of two or more out of final sheet-products, and cut this porous body sheet along the advancing direction of the sheet with a plurality of blades, thereby preparing a plurality of long sheets of the electrode material. This cutting step is a step of dividing the long electrode material into plural long sheets of the electrode material.

(Winding-Up Step)

This step is a step of winding up the electrode material in the form of the long sheets yielded in the cutting step onto a winding-up roller.

The following will describe the usage of the electrode material yielded as described above.

Main examples of an article wherein the electrode material, in which the aluminum porous body is used as a current collector, is used include an electrode for a nonaqueous electrolyte battery, such as a lithium battery or a molten salt battery; and an electrode, for a capacitor, wherein a nonaqueous electrolyte is used.

Hereinafter, use of these articles will be described.

(Lithium Battery)

The following will describe an electrode material for a battery, and a battery in each of which the aluminum porous body is used. When the aluminum porous body is used for a positive electrode of a lithium battery, the following may be used as an active material therefor: lithium cobaltate ($LiCoO_2$), lithium manganate ($LiMn_2O_4$), lithium nickelate ($LiNiO_2$) or some other. The active material is used in combination with a conduction aid and a binder. About any conventional positive electrode material for a lithium battery, an active material is applied onto surfaces of its aluminum foil. In order to improve battery capacity per unit area, the paint thickness of the active material is made large. Moreover, in order to make good use of the active material, it is necessary that the aluminum foil electrically contacts the active material; therefore, the active material is used in the form of a mixture with a conduction aid. By contrast, the aluminum porous body of the present invention is high in porosity and large in surface area per unit area. Thus, even when an active material is thinly carried onto the surface of the porous body, good use can be made of the active material so that the capacity of the battery can be improved and further the blend amount of the conduction aid can be made small. In a lithium battery, for its positive electrode, the above-mentioned positive electrode material is used while for its negative electrode, graphite, lithium titanate ($Li_4Ti_5O_{12}$), an alloy of Si and others, metallic lithium, or some other is used. For its electrolyte, an organic electrolyte or a solid electrolyte is used. Such a lithium battery can be improved in capacity even when the electrode area thereof is small. Thus, the battery can be made high in energy density than lithium batteries in the prior art.

(Electrode for Lithium Battery)

The electrolyte used in lithium batteries are classified into a nonaqueous electrolyte and a solid electrolyte.

Figure 13:
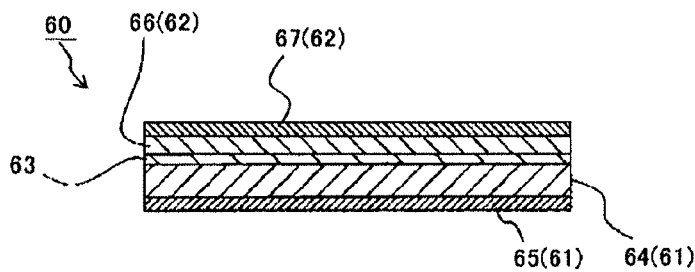
FIG. 13 is a schematic view illustrating an example of a structure wherein an aluminum porous body is applied to a lithium battery.

FIG. 13 is a vertical sectional view of an all-solid-state lithium battery. This all-solid-state lithium battery, which is a battery 60, has a positive electrode 61, a negative electrode 62, and an electrolyte layer 63 arranged between the two electrodes.

In the case of an organic solvent-based lithium battery, a separator made of a porous resin, a paper piece, or some other is arranged at a position corresponding to the electrolyte layer 63 between the positive electrode 61 and the negative electrode 62, and a nonaqueous electrolyte containing an organic liquid as a solvent and a lithium salt as a solute is held in pores in the positive electrode, the negative electrode and the separators. In this case, the separator wherein the nonaqueous electrolyte is held corresponds to the electrolyte layer 63. In the case of the all-solid-state lithium battery, a solid electrolyte such as $Li_2S$—$P_2S_6$ is used. The positive electrode 61 is composed of a positive electrode layer (positive electrode body) 64 and a current collector of positive electrode 65. The negative electrode 62 is composed of a negative electrode layer 66 and a negative electrode current collector 67.

(Active Material to be Filled into Aluminum Porous Body)

When the aluminum porous body is used for a positive electrode of a lithium battery, a material capable of inserting and removing lithium can be used as an active material therefor. This material is filled into the aluminum porous body, thereby making it possible to yield an electrode suitable for a lithium secondary battery. Examples of the material of the positive electrode active material include lithium cobaltate ($LiCoO_2$), lithium nickelate ($LiNiO_2$), lithium nickel cobalt oxide ($LiCo_{0.3}Ni_{0.7}O_2$), lithium manganate ($LiMn_2O_4$), lithium titanate ($Li_4Ti_5O_{12}$), lithium manganate compounds ($LiM_yMn_{2-y}O_4$ wherein M=Cr, Co or Ni), olivine compounds, which are lithium iron phosphate and compounds thereof ($LiFePO_4$, and $LiFe_{0.5}Mn_{0.5}PO_4$), and other transition metal oxides. The transition metal element(s) contained in each of these materials may be partially substituted with another transition metal oxide. The active material is used in combination with a conduction aid and a binder.

Other examples of the positive electrode active material include sulfide type chalcogen compounds such as $TiS_2$, $V_2S_3$, FeS, $FeS_2$, and LiMSx wherein M is a transition metal element such as Mo, Ti, Cu, Ni or Fe, or Sb, Sn or Pb), and lithium metals each having a skeleton of a metal oxide such as $TiO_2$, $Cr_3O_8$, $V_2O_5$, or $MnO_2$. Lithium titanate ($Li_4Ti_5O_{12}$), which has been described above, may be used as a negative electrode active material.

(Electrolytic Solution Used in Lithium Battery)

The nonaqueous electrolyte is used in a polar aprotic organic solvent, and specific examples of the solvent include ethylene carbonate, diethyl carbonate, dimethyl carbonate, propylene carbonate, γ-butyrolactone, and sulfolane. As a supporting salt therein, the following may be used: lithium tetrafluoroborate, lithium hexafluorophosphate, an imide salt, or some other.

(Solid Electrolyte Filled into Aluminum Porous Body)

Besides the active material, a solid electrolyte may be further added and filled into the porous body. The filling of the active material and the solid electrolyte into the aluminum porous body makes it possible to render the aluminum porous body an electrode suitable for an all-solid-state lithium battery. However, the proportion of the active material in the substances filled into the aluminum porous body is set preferably into 50% by mass or more, more preferably into 70% by mass or more in order to keep the discharge capacity certainly.

The solid electrolyte is preferably a sulfide type solid electrolyte, which is high in lithium ion conductivity. An example of this sulfide type solid electrolyte is a sulfide type solid electrolyte containing lithium, phosphorus, and sulfur. The sulfide type solid electrolyte may further contain O, Al, B, Si, Ge or some other element.

The sulfide type solid electrolyte may be obtained by a known method. The method is, for example, a method of preparing lithium sulfide ($Li_2S$) and diphosphorus pentasulfide ($P_2S_5$) as starting materials, mixing $Li_2S$ and $P_2S_5$ with each other at a mole ratio of about 50:50 to 80:20, melting this mixture, and then cooling the mixture rapidly (the melting and rapid quenching method), and a method of milling this mixture mechanically (the mechanical milling method).

The sulfide type solid electrolyte obtained by this method is amorphous. The amorphous electrolyte may be used as it is. By subjecting this electrolyte to a heating treatment, the electrolyte may be used in the form of a crystalline sulfide type solid electrolyte. By the crystallization, the solid electrolyte can be expected to be improved in lithium ion conductivity.

(Filling Active Material into Aluminum Porous Body)

For the filling of the active material (the active material and the solid electrolyte), a known method, such as an immersion filling method or a coating method, may be used. Examples of the coating method include a roll coating method, an applicator coating method, an electrostatic coating method, a powder coating method, a spray coating method, a spray coater coating method, a bar coater coating method, a roll coater coating method, a dip coater coating method, a doctor blade coating method, a wire bar coating method, a knife coater coating method, and a blade coating method, and screen printing methods.

At the time of the filling of the active material (the active material and the solid electrolyte), for example, a conduction aid and a binder are optionally added thereto, and then an organic solvent is incorporated into this mixture to prepare a slurry mixture of positive electrode materials. This is filled into the aluminum porous body by the above-mentioned method. In order to prevent the aluminum porous body from being oxidized, it is preferred to perform the filling of the active material (the active material and the solid electrolyte) in an inert gas atmosphere. The conduction aid may be, for example, a carbon black such as acetylene black (AB) or Ketjen Black (KB). The binder may be, for example, polyvinylidene fluoride (PVDF) or polytetrafluoroethylene (PTFE).

The organic solvent used when the slurry mixture of positive electrode materials is prepared may be appropriately selected as far as the solvent produces no bad effect onto the materials filled into the aluminum porous body (i.e., the active material, the conduction aid, the binder and the optional solid electrolyte). Examples of the organic solvent include n-hexane, cyclohexane, heptane, toluene, xylene, trimethylbenzene, dimethyl carbonate, diethyl carbonate, ethylmethyl carbonate, propylene carbonate, ethylene carbonate, butylene carbonate, vinylene carbonate, vinylethylene carbonate, tetrahydrofuran, 1,4-dioxane, 1,3-dioxolane, ethylene glycol, and N-ethyl-2-pyrrolidone.

About conventional positive electrode materials for a lithium battery, an active material is painted onto their aluminum foil surfaces. The paint thickness of the active material is made large in order to improve battery capacity per unit area. In order to make good use the active material, it is necessary that the aluminum foil electrically contacts the active material; thus, the active material is used in the form of a mixture with a conduction aid. By contrast, the aluminum porous body is high in porosity and large in surface area per unit area thereof. Thus, even when the active material is thinly carried on the porous body surface, good use can be made of the active material so that the capacity of the battery can be improved and further the blend amount of the conduction aid can be reduced. In a lithium battery, the above-mentioned positive electrode material, graphite, and an organic electrolyte are used as its positive electrode, its negative electrode, and its electrolyte, respectively. Even when this lithium battery is small in electrode area, the battery can be improved in capacity so that the battery can be made higher in energy density than conventional lithium batteries.

(Electrode for Capacitor Wherein Nonaqueous Electrolytic Solution is Used)

Figure 14:
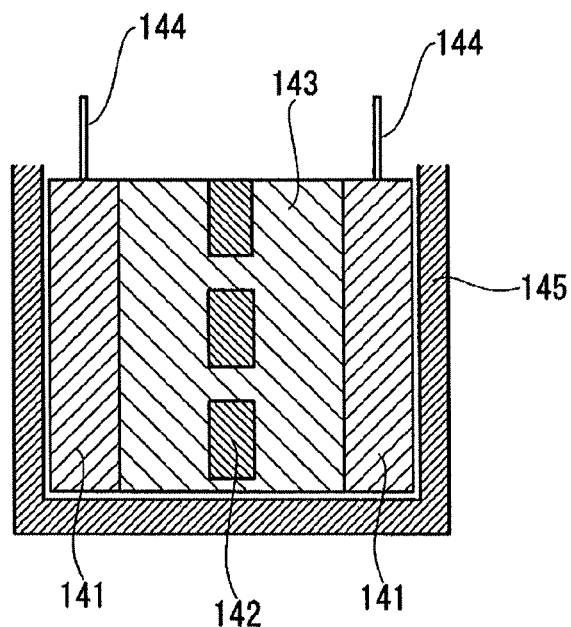
FIG. 14 is a schematic view illustrating an example of a structure wherein an aluminum porous body is applied to a capacitor using a nonaqueous electrolyte.

FIG. 14 is a schematic sectional view illustrating an example of a capacitor making use of a nonaqueous electrolyte, wherein an electrode material for a capacitor making use of the nonaqueous electrolyte is used. In an organic electrolyte 143 partitioned by a separator 142, electrode materials in each of which an electrode active material is carried on an aluminum porous body are arranged as polarizable electrodes 141. The polarizable electrodes 141 are each connected to a lead wire 144. The whole of these members is held in a case 145. The use of the aluminum porous body as each current collector makes the surface area of the current collector large. Thus, even when activated carbon as the active material is thinly painted, the obtained capacitor, wherein the nonaqueous electrolyte is used, makes it possible to attain a high power and a high capacity.

In order to produce this electrode for a capacitor making use of the nonaqueous electrolyte, activated carbon is used, in the current collectors, as the respective active materials. The activated carbon is used in combination with a conduction aid and a binder. The conduction aid may be, for example, graphite, or carbon nanotubes. The binder may be, for example, polytetrafluoroethylene (PTFE), or a styrene/butadiene rubber.

A paste of the activated carbon is filled. In order to make the capacity of the capacitor large, it is more preferred that the amount of the activated carbon as a main component is larger. After the paste is dried (after the solvent is removed), the proportion of the activated carbon in the composition is preferably 90% or more. Although the conduction aid and the binder are necessary, the respective proportions thereof are preferably as small as possible since these components cause a fall in the capacity and the binder further causes an increase in the internal resistance. Preferably, the proportion of the conduction aid is 10% by mass or less, and that of the binder is 10% by mass or less.

As the surface area of the activated carbon is larger, the capacity of the capacitor is larger. Thus, the specific surface area is preferably 2000 m$^2$/g or more. The conduction aid may be Ketjen Black, acetylene black or a carbon fiber, or a composite material thereof. The binder may be polyvinylidene fluoride, polytetrafluoroethylene, polyvinyl alcohol, carboxymethylcellulose, xanthan gum, or some other. It is advisable to select, as the solvent, water or an organic solvent appropriately in accordance with the kind of the binder. As the organic solvent, N-methyl-2-pyrrolidone is used in many cases. When water is used as the solvent, a surfactant may be used to improve the paste in filling performance.

The components of the above-mentioned electrode material, which is made mainly of activated carbon, are mixed with each other, and stirred, thereby obtaining an activated carbon paste. This activated carbon paste is filled into the current collector, and dried, and optionally the thickness of the resultant is adjusted by a roller press or some other machine, thereby yielding an electrode for a capacitor.

(Production of Capacitor)

The electrode yielded as described above is punched out into electrode pieces having an appropriate size, and two of the pieces are prepared. The two are opposed to each other to sandwich a separator therebetween. While necessary spacers are used, the combined members are packaged into a cell case. The members are then impregnated with an electrolyte. Finally, a lid is fitted to the case to interpose an insulating gasket therebetween to seal the inside, thereby making it possible to produce a capacitor wherein the nonaqueous electrolyte is used. When the nonaqueous material is used, the content of water in the capacitor is made limitlessly small. For this matter, the production of the capacitor is made in an environment wherein the water content is small, and the sealing is attained in a reduced-pressure environment. As far as the current collector or the electrode of the present invention is used in a capacitor, the capacitor is not particularly limited in production process. Thus, the capacitor may be a capacitor that is produced by any production process other than the above-mentioned process.

The negative electrode is not particularly limited, and may be any conventional electrode as a negative electrode. However, a conventional electrode wherein an aluminum foil is used as a current collector is small in capacity; thus, the negative electrode is preferably an electrode wherein an active material is filled into a porous body, such as the above-mentioned foamed nickel.

The electrolyte may be a solution of an aqueous type or a nonaqueous type. The nonaqueous electrolyte is preferred since the solution makes it possible to set a high voltage. In the aqueous type electrolyte, potassium hydroxide or some other may be used as its electrolyte. In the nonaqueous type electrolyte, an ionic liquid may be used, examples thereof including many combinations each composed of a cation and an anion. The cation may be, for example, a lower aliphatic quaternary ammonium, a lower aliphatic quaternary phosphonium, or an imidazolium salt, and the anion may be, for example, a metal chloride ion, a metal fluoride ion, or an imide compound such as bis(fluorosulfonyl)imide. A polar aprotic organic solvent may be used, specific examples thereof including ethylene carbonate, diethyl carbonate, dimethyl carbonate, propylene carbonate, γ-butyrolactone, and sulfolane. A supporting salt in the nonaqueous electrolyte may be lithium tetrafluoroborate, lithium hexafluorophosphate, an imide salt, or some other.

(Electrode for Molten Salt Battery)

The aluminum porous body may be used as an electrode material for a molten salt battery. When the aluminum porous body is used as a positive electrode material thereof, the following may be used as an active material therefor: sodium chromite ($NaCrO_2$), titanium disulfide ($TiS_2$), or any other metal compound capable of intercalating the cation of the molten salt, which is an electrolyte. The active material is used in combination with a conduction aid and a binder. The conduction aid may be acetylene black, or some other. The binder may be polytetrafluoroethylene (PTFE), or some other. When sodium chromate is used as the active material and acetylene black is used as the conduction aid, PTFE is preferred since this polymer makes it possible to bond and fix the two more strongly.

The aluminum porous body may be used as a negative electrode active material for a molten salt battery. When the aluminum porous body is used as the negative electrode active material, the following may be used as an active material therefor: a simple substance of sodium, an alloy of sodium and another metal, carbon, or some other. Sodium has a melting point of about 98° C., and further the metal is softened as the temperature thereof is raised; therefore, it is preferred that sodium is combined with another metal or a nonmetal (such as Si, Sn or In) to be alloyed. A substance obtained by alloying sodium and Sn is particularly preferred since the substance is easily handled. Sodium or any sodium alloy can be carried onto the surface of the aluminum porous body by electroplating, hot dipping, or some other method. By depositing sodium, and a metal or nonmetal (such as Si) to be alloyed therewith onto the aluminum porous body by plating or some other method, and then performing electrification in a molten salt battery, a sodium alloy can also be prepared.

Figure 15:
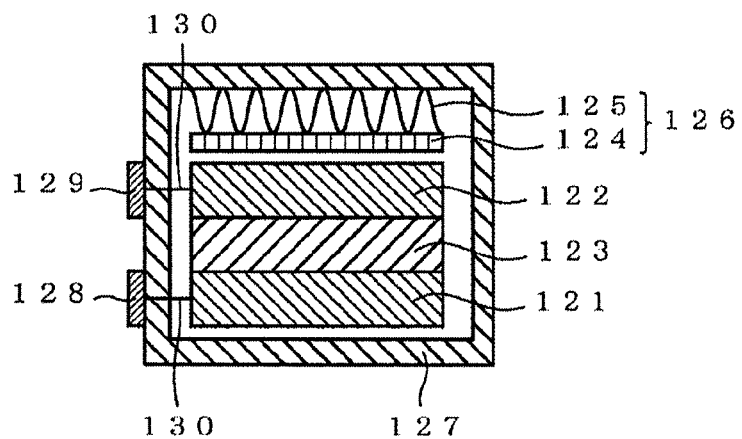
FIG. 15 is a schematic sectional view illustrating an example of a structure wherein an aluminum porous body is applied to a molten salt battery.

FIG. 15 is a schematic sectional view illustrating an example of a molten salt battery wherein the above-mentioned battery electrode material is used. The molten salt battery is a battery obtained by packaging, into a case 127, a positive electrode 121 in which a positive electrode active material is carried on the surface of aluminum skeleton regions of an aluminum porous body, a negative electrode 122 in which a negative electrode active material is carried on the surface of aluminum skeleton regions of another aluminum porous body, and a separator 123 impregnated with a molten salt which is an electrolyte. Between the top surface of the case 127 and the negative electrode, a pressing member 126 is arranged which is composed of a holding plate 124 and a spring 125 for pressing the holding plate. The setting of the pressing member makes it possible to press the positive electrode 121, the negative electrode 122 and the separator 123 evenly to contact the members each other even when these members are changed in volume. The current collector (aluminum porous body) of the positive electrode 121 and the current collector (aluminum porous body) of the negative electrode 122 are connected to a positive electrode terminal 128 and a negative electrode terminal 129, respectively, through respective lead wires 130.

The molten salt as the electrolyte may be an inorganic salt or organic salt which is molten at the operating temperature, and which may be of various types. The cation of the molten salt may be one or more selected from alkali metals such as lithium (Li), sodium (Na), potassium (K), rubidium (Rb), and cesium (Cs), and alkaline earth metals such as beryllium (Be), magnesium (Mg), calcium (Ca), strontium (Sr), and barium (Ba).

In order to lower the melting point of the molten salt, it is preferred to use two or more salts in a mixture form. For example, the use of the following combination makes it possible to make the operating temperature of the battery to 90° C. or lower: potassium bis(fluorosulfonyl)amide <K—N(SO$_2$F)$_2$ (KFSA)>, and sodium bis(fluorosulfonyl)amide <Na—N(SO$_2$F)$_2$ (NaFSA)>.

The molten salt is used in the state that the salt is impregnated into the separator. The separator is a member for preventing the positive electrode and the negative electrode from contacting each other, and may be a glass nonwoven fabric, a porous body of a porous resin, or some other. The abovementioned positive electrode, negative electrode and separator impregnated with the molten salt are laminated onto each other, and the laminate is packaged into a case. The resultant is used as a battery.

EXAMPLES

Hereinafter, the present invention will be described in more detail by way of examples; however, the present invention is not limited to these examples.

Example 1

Formation of Conductive Layer

The following was prepared as a urethane resin porous body: a urethane foam having a porosity of 95%, about 50 pores (cells) per inch, and a pore diameter (cell diameter) of about 550 μm, and a thickness of 1 mm. This was cut into a piece of 100 mm square. An aluminum film was formed on the surface of this polyurethane foam by a sputtering method to give a deposit amount of 10 g/m$^2$, thereby subjecting the foam to an electrically conduction treatment.

The used urethane resin porous body was a porous body formed by the following: when the foaming raw material of the polyurethane was continuously foamed in a sheet-form mold in the step of foaming the polyurethane, the upper and lower planes of the mold were warmed to 60° C.

(Molten Salt Plating)

The urethane foam, the surface of which had the formed conductive layer, was used as a workpiece, and set to a tool having a power supplying function. The foam was then put into a globe box containing an argon atmosphere and having a lower water content (dew point: −30° C. or lower), and immersed in a molten salt aluminum plating bath (33% by mole of EMIC/67% by mole of AlCl$_3$) of 40° C. temperature. The tool, to which the workpiece was set, was connected to the negative electrode side of a rectifier, and an aluminum plate (purity: 99.99%) as a counter electrode was connected to the positive electrode side. A direct current having a current density of 3.6 A/dm$^2$ was applied thereto for 90 minutes to plate the workpiece, thereby yielding an aluminum structural body wherein an aluminum plating layer having a weight of 150 g/m$^2$ was formed on any surface of the urethane foam. The bath was stirred with a stirrer using a rotor made of Teflon (registered trade name). The current density was a value obtained by making a calculation using the apparent area of the urethane foam.

(Decomposition of Resin Foam Shaped Body)

The aluminum structural body was immersed in a LiCl—KCl eutectic molten salt of 500° C. temperature, and a negative potential of −1 V was applied thereto for 30 minutes. Bubbles were generated in the molten salt by a decomposition reaction of the polyurethane. Thereafter, the structural body was cooled to room temperature in the atmosphere, and then washed with water to remove the molten salt. In this way, a resin-removed aluminum porous body 1 was yielded. The resultant aluminum porous body had continuous pores, and the porosity thereof was as high as that of the urethane foam used as the core member.

(Working of End of Aluminum Porous Body)

The resultant aluminum porous body was adjusted into a thickness of 0.96 mm by a roller press. The porous body was then cut into a piece of 5 cm square.

For preparation for the welding, a SUS block (rod) of 5 mm width, as a compressing tool, and a hammer were used, and the SUS block was put onto a region of the aluminum porous body that extended over a length of 5 mm from an end of one side of the body. The hammer was hit on the SUS block to compress the porous body. In this way, a compressed region of 100 μm thickness was formed.

Thereafter, tab leads were welded thereto by spot welding under conditions described below:

<Welding Conditions>
Welding machine: Hi-Max 100, model No. YG-101UD, manufactured by Panasonic Corporation (a voltage of 250 V can be applied at most)
Capacity: 100 Ws, 0.6 kVa
Electrodes: copper electrodes having a diameter of 2 mm
Load: 8 kgf
Voltage: 140 V
<Tab Leads>
Material: aluminum
Size: a width of 5 mm, a length of 7 cm, and a thickness of 100 μm
Surface state: boehmite worked An epoxy resin was filled into an opening in the resultant aluminum porous body 1, and the porous body was polished to create a cross section. The cross section of the porous body was observed with a microscope, and photographed. The photograph was divided into three regions in the thickness direction of the porous body, and the regions were named the region 1, the region 2 and the region 3, respectively. By image processing, the number of aluminum skeleton ribs of each of the regions was counted. The reciprocal thereof was calculated. Using the value of the region 2 as a standard, the ratio of the numerical value of each of the other regions thereto was gained.

The results are as shown in Table 1. The ratio of the reciprocal of the number of the aluminum skeleton ribs in the region 1 to that in the region 2 was 1.19. In the same manner, the ratio of the reciprocal of the number of the aluminum skeleton ribs in the region 3 to that in the region 2 was 1.19.

Example 2

An aluminum porous body 2 was formed in the same way as in Example 1 except the use of a urethane resin having a thickness of 1.0 mm, 50 cells, and a cell diameter of 550 μm, and formed by the following: when the foaming raw material of the polyurethane was continuously foamed in a sheet-form mold in the step of foaming the polyurethane, the upper and lower planes of the mold were cooled to 5° C.

In the same way as in Example 1, a cross section of the resultant aluminum porous body 2 was observed.

The results are as shown in Table 1. The ratio of the reciprocal of the number of the aluminum skeleton ribs in the region 1 to that in the region 2 was 0.84. In the same manner, the ratio of the reciprocal of the number of the aluminum skeleton ribs in the region 3 to that in the region 2 was 0.84.

Example 3

An aluminum porous body 3 was formed in the same way as in Example 1 except the use of a urethane resin having a thickness of 1 mm, 50 cells, and a cell diameter of 550 μm, and formed by the following: when the foaming raw material of the polyurethane was continuously foamed in a sheet-form mold in the step of foaming the polyurethane, the upper plane of the mold was warmed to 60° C., and the lower plane was cooled to 5° C.

In the same way as in Example 1, a cross section of the resultant aluminum porous body 3 was observed. A microscopic photograph thereof was divided into two regions in the thickness direction of the porous body, and one of the regions was named the region 4, and the other the region 5. In the same way as in Example 1, the reciprocal of the number of aluminum skeleton ribs in each of the regions 4 and 5 was counted.

The results are as shown in Table 1. The ratio of the reciprocal of the number of the aluminum skeleton ribs in the region 4 to that in the region 5 was 1.28.

Example 4

Aluminum porous bodies A and C were each formed in the same way as in Example 1 except the use of a urethane resin having a thickness of 0.33 mm, 35 cells, and a cell diameter of 790 μm, and formed by the following: when the foaming raw material of the polyurethane was continuously foamed in a sheet-form mold in the step of foaming the polyurethane, the temperature of the upper and lower planes of the mold was set to 25° C.

An aluminum porous body B was formed in the same way as in Example 1 except the use of a urethane resin having a thickness of 0.34 mm, 55 cells, and a cell diameter of 500 μm, and formed by the following: when the foaming raw material of the polyurethane was continuously foamed in a sheet-form mold in the step of foaming the polyurethane, the temperature of the upper and lower planes of the mold was set to 25° C.

The resultant aluminum porous bodies A to C were laminated onto each other to sandwich the aluminum porous body B between the aluminum porous bodies A and C. While pressure was applied thereto, the laminate was heated to integrate the porous bodies with each other. In this way, an aluminum porous body 4 was yielded.

In the same way as in Example 1, a cross section of the resultant aluminum porous body 4 was observed.

The results are as shown in Table 1. The ratio of the reciprocal of the number of the aluminum skeleton ribs in the region 1 (the region originating from the aluminum porous body A) to that in the region 2 (the region originating from the aluminum porous body B) was 1.58. In the same manner, the ratio of the reciprocal of the number of the aluminum skeleton ribs in the region 3 (the region originating from the aluminum porous body C) to that in the region 2 was 1.58.

Example 5

Aluminum porous bodies D and F were each formed in the same way as in Example 1 except the use of a urethane resin having a thickness of 0.33 mm, 55 cells, and a cell diameter of 500 μM, and formed by the following: when the foaming raw material of the polyurethane was continuously foamed in a sheet-form mold in the step of foaming the polyurethane, the temperature of the upper and lower planes of the mold was set to 25° C.

An aluminum porous body E was formed in the same way as in Example 1 except the use of a urethane resin having a thickness of 0.34 mm, 35 cells, and a cell diameter of 790 μm, and formed by the following: when the foaming raw material of the polyurethane was continuously foamed in a sheet-form mold in the step of foaming the polyurethane, the temperature of the upper and lower planes of the mold was set to 25° C.

The resultant aluminum porous bodies D to F were laminated onto each other to sandwich the aluminum porous body E between the aluminum porous bodies D and F. While pressure was applied thereto, the laminate was heated to integrate the porous bodies with each other. In this way, an aluminum porous body 5 was yielded.

In the same way as in Example 1, a cross section of the resultant aluminum porous body 5 was observed.

The results are as shown in Table 1. The ratio of the reciprocal of the number of the aluminum skeleton ribs in the region 1 (the region originating from the aluminum porous body D) to that in the region 2 (the region originating from the aluminum porous body E) was 0.63. In the same manner, the ratio of the reciprocal of the number of the aluminum skeleton ribs in the region 3 (the region originating from the aluminum porous body F) to that in the region 2 was 0.63.

Example 6

An aluminum porous body G was formed in the same way as in Example 1 except the use of a urethane resin having a thickness of 0.5 mm, 35 cells, and a cell diameter of 790 and formed by the following: when the foaming raw material of the polyurethane was continuously foamed in a sheet-form mold in the step of foaming the polyurethane, the temperature of the upper and lower planes of the mold was set to 25° C.

An aluminum porous body H was formed in the same way as in Example 1 except the use of a urethane resin having a thickness of 0.5 mm, 55 cells, and a cell diameter of 500 μm, and formed by the following: when the foaming raw material of the polyurethane was continuously foamed in a sheet-form mold in the step of foaming the polyurethane, the temperature of the upper and lower planes of the mold was set to 25° C.

The resultant aluminum porous bodies G and H were laminated onto each other. While pressure was applied thereto, the laminate was heated to integrate the porous bodies with each other. In this way, an aluminum porous body 6 was yielded.

In the same way as in Example 1, a cross section of the resultant aluminum porous body 6 was observed. A microscopic photograph thereof was divided into two regions in the thickness direction of the porous body, and one of the regions was named the region 4, and the other the region 5. In the same way as in Example 1, the reciprocal of the number of aluminum skeleton ribs in each of the regions 4 and 5 was counted.

The results are as shown in Table 1. The ratio of the reciprocal of the number of the aluminum skeleton ribs in the region 4 (the region originating from the aluminum porous body G) to that in the region 5 (the region originating from the aluminum porous body H) was 1.58.

Comparative Example 1

An aluminum porous body 7 was formed in the same way as in Example 1 except the use of a urethane resin having a thickness of 1.0 mm, 50 cells, and a cell diameter of 550 μm, and formed by the following: when the foaming raw material of the polyurethane was continuously foamed in a sheet-form mold in the step of foaming the polyurethane, the temperature of the upper and lower planes of the mold was set to 25° C.

In the same way as in Example 1, a cross section of the resultant aluminum porous body 7 was observed.

The results are as shown in Table 1. The ratio of the reciprocal of the number of the aluminum skeleton ribs in the region 1 to that in the region 2 was 1.00. In the same manner, the ratio of the reciprocal of the number of the aluminum skeleton ribs in the region 3 to that in the region 2 was 1.01.

the negative electrode were laminated onto each other to interpose a separator made of polypropylene therebetween. This was packaged into a coin type battery case having a positive electrode can and a negative electrode can each made of stainless steel. An organic electrolyte was then injected into the battery case. The used organic electrolyte was a solution wherein $LiClO_4$ was dissolved in a mixed organic solvent of propylene carbonate and 1,2-dimethoxyethane (ratio by volume: 1:1) to give a concentration of 1% by mole. After the injection of the organic electrolyte, a gasket made of a resin was sandwiched between the positive electrode can and the negative electrode can, and then these cans were caulked with

TABLE 1

| | Regions | Number of cells (cell-population per inch) | Cell diameter [μm] | Resin porous body thickness [mm] | Foaming temperature [° C.] Upper plane | Foaming temperature [° C.] Lower plane | Cell diameter ratio (ratio between reciprocals of numbers of skeleton ribs) | Cell diameter distribution in thickness direction |
|---|---|---|---|---|---|---|---|---|
| Example 1 | 1-3 | 50 | 550 | 1 | 60 | 60 | Region 1:1.19 Region 2:1.00 Region 3:1.19 | 1.19 |
| Example 2 | 1-3 | 50 | 550 | 1 | 5 | 5 | Region 1:0.84 Region 2:1.00 Region 3:0.84 | 0.84 |
| Example 3 | 4-5 | 50 | 550 | 1 | 60 | 5 | Region 4:1.28 Region 5:1.00 | 1.28 |
| Example 4 | A | 35 | 790 | 0.33 | 25 | 25 | 1.58 | 1.58 |
| | B | 55 | 500 | 0.34 | 25 | 25 | 1 | |
| | C | 35 | 790 | 0.33 | 25 | 25 | 1.58 | |
| Example 5 | D | 55 | 500 | 0.33 | 25 | 25 | 0.63 | 0.63 |
| | E | 35 | 790 | 0.34 | 25 | 25 | 1 | |
| | F | 55 | 500 | 0.33 | 25 | 25 | 0.63 | |
| Example 6 | G | 35 | 790 | 0.5 | 25 | 25 | 1.58 | 1.58 |
| | H | 55 | 500 | 0.5 | 25 | 25 | 1 | |
| Comparative Example 1 | 1-3 | 50 | 550 | 1 | 25 | 25 | Region 1:1.00 Region 2:1.00 Region 3:1.01 | 1 |

—Production of Lithium Secondary Batteries—

As an active material, prepared was a lithium cobaltate powder (positive electrode active material) having an average particle diameter of 5 μm. This lithium cobaltate powder, acetylene black (conduction aid), and PVDF (binder) were mixed with each other at a ratio by mass percentage of 90:5:5. To this mixture was dropwise added N-methyl-2-pyrrolidone (organic solvent) to mix the solvent with the other components, thereby yielding a paste-like slurry mixture of positive electrode materials.

Next, this slurry mixture of positive electrode materials was filled into aluminum porous body samples formed by Examples 1 to 6, and Comparative Example 1 to make the individual positive electrode mixture amounts equal to each other. Thereafter, the samples were dried at 100° C. for 40 minutes to remove the organic solvent, and further the samples were each compressed by a roller press (roller gap: 0.2 mm) to yield positive electrode samples 1 to 7. Each of the positive electrodes had a thickness of 500 μm and a capacity per area of 10 mAh/cm².

The positive electrode samples 1 to 7 were each used to produce an electrolyte type lithium secondary battery as follows:

As a positive electrode, use was made of an electrode obtained by punching out each of the samples 1 to 7 into a diameter of 14 mm. As a negative electrode, use was made of a lithium metal foil (diameter: 15 mm, and thickness: 500 μm). The positive electrode (positive electrode sample) and each other to seal the inside to produce a coin type electrolyte type lithium secondary battery.

The battery for evaluation was produced about each of the positive electrode samples. When any one of the positive electrode samples was used, no leaf spring was inserted between the positive electrode sample and the positive electrode can.

The electrolyte type lithium secondary batteries using the positive electrode samples 1 to 7, respectively, were evaluated as follows:

(Rate Characteristic Evaluation)

In this evaluation, each of some of the batteries was subjected to charge/discharge cycles wherein the charge/discharge current was 3 mA and the voltage was set into the range of 4.2 to 2.0 V, and then the discharge capacity was measured. The battery was charged at a charge current of 3 mA, and then the discharge capacity thereof was measured at respective discharge currents of 10 mA and 50 mA. The ratio of each of the resultant values to the discharge capacity at 3 mA was examined.

As shown in Table 2, it is understood that Examples 1 and 4 were better in rate characteristic (current collecting performance) than Comparative Example 1.

(Cycle Characteristic Evaluation)

Furthermore, a charge/discharge cycle test was made to examine the lifespan of each of some of the batteries. In this evaluation, charge/discharge cycles were made wherein the charge/discharge current was 3 mA and the voltage was set into the range of 4.2 to 2.0 V to make a change in the discharge capacity. After 100 and 1000 cycles of the charge/discharge cycles, the capacity was checked, and then the battery was dismantled to observe the inside. The discharge capacity is represented by the percentage of the checked capacity in the capacity in the first discharging as a standard.

As shown in Table 2, it is understood that Example 2 or 5 was better in cycle life (holding performance of the active material) than Comparative Example 1. Additionally, the batteries after the 1000 cycles were dismantled, and the respective insides thereof were observed. As a result, in Comparative Example 1, the active material dropped away from the electrodes to be liberated in the electrolyte. It is understood from this matter that in Example 2 or 5, the active material was more strongly held so that an advantage in cycle life was produced.

(Bending Workability)

Aluminum porous bodies 3 as yielded in Example 3, as well as the bodies 6 and 7 as yielded in Example 6 and Comparative Example 1, were each used to yield a negative electrode sample in the same way as used to produce the positive electrode samples except that a lithium titanate powder having an average particle diameter of 5 μm was used as an active material.

Positive electrode samples 3, 6 and 7 were each cut into a piece 45 mm wide and 230 mm long. An aluminum lead wire was welded to the cut piece. In the same way, the negative electrode samples 3, 6 and 7, were each cut into a piece 45 mm wide and 280 mm long. Separators were each cut into a piece 50 mm wide and 500 mm long, and the piece was twice-folded. One of the positive electrodes 3 was sandwiched between the half regions of one of the separator pieces, and the resultant was put onto one of the negative electrodes 3. The workpiece was wound to make the negative electrode exposed outward. In this way, a group of the electrodes was yielded. In the same way, use was made of a pair of one of the positive electrodes 6 and one of the negative electrodes 6, and a pair of one of the positive electrodes 7 and one of the negative electrodes 7 to yield wound electrode groups. In Example 3 or 6, the winding was performed to face the electrode having a larger cell diameter outward.

These electrode groups were each inserted into a negative electrode electrolytic tank can for a 18650 cylindrical battery, and then the lead wire of the positive electrode, and a positive electrode lid to which a resin gasket was attached were welded to each other. An electrolyte was injected thereinto, the solution being a solution wherein $LiClO_4$ was dissolved in a mixed organic solvent of propylene carbonate and 1,2-dimethoxyethane (ratio by volume: 1:1) to give a concentration of 1% by mole. The positive electrode lid and the negative electrode can were caulked with each other to seal the inside, thereby yielding a cylindrical lithium secondary battery 18 mm in diameter and 65 mm in height. Thereafter, in order to evaluate the bending workability of the electrodes, the battery was examined about the generation percentage of short circuit after the winding/fabrication.

As shown in Table 2, it is understood that Example 3 or 6 was lower in short circuit generation percentage after the winding than Comparative Example 1.

TABLE 2

|  | Rate characteristic (current collecting performance) | | Cycle life (active material holding performance) | | Short circuit generation percentage [%] after winding (bending workability) |
| --- | --- | --- | --- | --- | --- |
|  | Discharge capacity at 10 mA | Discharge capacity at 50 mA | After 100 cycles | After 1000 cycles | |
| Example 1 | 101 | 92 | — | — | — |
| Example 2 | — | — | 100 | 89 | — |
| Example 3 | — | — | — | — | 0.3 |
| Example 4 | 100 | 96 | — | — | — |
| Example 5 | — | — | 101 | 95 | — |
| Example 6 | — | — | — | — | 0.1 |
| Comparative Example 1 | 100 | 87 | 100 | 79 | 1.3 |

The following will describe examples other than the above-mentioned examples.

Example 7

Formation of Aluminum Porous Body

As urethane resin porous bodies, prepared were a polyurethane foam (urethane foamed body) having a porosity of about 97%, a pore diameter (cell diameter) of about 200 μm, and a thickness of about 500 μm, and a polyurethane foam (urethane foamed body) having a porosity of about 97%, a pore diameter (cell diameter) of about 400 μm, and a thickness of about 500 μm. These urethane foams were substantially even in cell diameter in the thickness direction.

Next, about each of the urethane foams, pure aluminum was molten and evaporated to form an aluminum layer on any surface of the urethane foam by a vacuum vapor deposition. Conditions for the vacuum deposition were as follows: the vacuum degree was set to $1.0 \times 10^{-5}$ Pa; the temperature of the urethane foam, on which the film was to be formed, to room temperature; and the distance between the evaporation source and the urethane foam, to 300 mm. After the formation of the aluminum layer on the surface of each of these urethane foamed bodies, an SEM was used to observe the urethane foamed body (aluminum structural body), wherein the aluminum layer was formed on the resin surface. As a result, the thickness of the aluminum layer was 15 μm.

The aluminum structural bodies were each immersed in a LiCl—KCl eutectic molten salt of 500° C. temperature, and further in the state a negative voltage was applied to the aluminum layer for 30 minutes to make the potential of the aluminum layer into −1 V relatively to the reduction potential of aluminum. At this time, it was recognized that bubbles were generated in the molten salt. It is presumed that this was based on thermal decomposition of the polyurethane.

Next, the skeleton (aluminum porous body) yielded in the above-mentioned step, which was made of the aluminum yielded after each of the urethane foamed bodies was thermally decomposed, was cooled to room temperature in the atmosphere, and then washed with water to remove the molten salt adhering to the surface. In this way, two types of aluminum porous bodies were finished.

Of the produced aluminum porous bodies, one (wherein the resin body of about 200 μm cell diameter was used) had a porosity of 97%, a cell diameter of 200 μm and a thickness of 500 μm, and the other (wherein the resin body of about 400 μm cell diameter was used) had a porosity of 97%, a cell diameter of 400 μm and a thickness of 500 μm. The aluminum porous bodies were each observed with an SEM. As a result, its pores were continuous to each other, and no closed pores were observed. Furthermore, the surface of each of the aluminum porous bodies was quantitatively analyzed by EDX at an accelerating voltage of 15 kV. As a result, no oxygen peak was observed. In other words, no oxygen was detected. Accordingly, the oxygen content in the surface of each of the aluminum porous bodies was below the detection limit thereof according to EDX, that is, 3.1% by mass or less. The instrument used in the analysis was "EDAX Phoenix, model type: HIT22 136-2.5" manufactured by EDAX Inc.

Furthermore, the aluminum porous bodies were used to produce a bilayered-structure aluminum porous body 8, and a trilayered-structure aluminum porous body 9, respectively. Specifically, the bilayered-structure aluminum porous body 8 was produced by laminating the porous body of 200 μm cell diameter and the porous body of 400 μm cell diameter onto each other, and bonding the porous bodies by spot welding while their surfaces were pushed onto each other. Separately, the trilayered-structure aluminum porous body 9 was produced by preparing one aluminum porous body of 200 μm cell diameter, preparing two porous bodies of 400 μm cell diameter, laminating the porous bodies of 400 μm cell diameter onto both surfaces of the porous body of 200 μm cell diameter, respectively, and bonding the porous bodies by spot welding while their surfaces were pushed onto each other. In other words, the bilayered-structure aluminum porous body 8 had a large-cell-diameter region and a small-cell-diameter region in the thickness direction, and the trilayered-structure aluminum porous body 9 had a large-cell-diameter region, a small-cell-diameter region, and another large-cell-diameter region in turn in the thickness direction.

Comparative Example 2

For comparison, prepared were two types of polyurethane foams (urethane foamed bodies) having a porosity of about 97%, a pore diameter (cell diameter) of about 200 μm, and respective thicknesses of 1000 μm and 1500 μm. In the same way as used to produce the aluminum porous bodies of Example 7, aluminum porous bodies 10 and 11 having different thicknesses were produced. Each of the aluminum porous bodies 10 and 11 had a porosity of 97% and a cell diameter of 200 μm, and had, in the surface thereof, an oxygen content of 3.1% by mass or less.

(Production of Electrodes for Nonaqueous Electrolyte Batteries)

An active material was filled into each of the aluminum porous bodies 8 to 11 to produce a positive electrode for a lithium secondary battery.

In the production, prepared was a $LiCoO_2$ powder (positive electrode active material) having an average particle diameter of 10 μm. This $LiCoO_2$ powder, AB (conduction aid), and PVDF (binder) were mixed with each other at a ratio by mass percentage of 90:5:5. To this mixture was dropwise added N-methyl-2-pyrrolidone (organic solvent) to mix the solvent with the other components, thereby yielding a paste-like slurry mixture of positive electrode materials. Next, each of the aluminum porous bodies was impregnated into this slurry mixture of positive electrode materials to fill the aluminum porous body with the positive electrode mixture. Thereafter, the aluminum porous body was dried at 100° C. for 40 minutes to remove the organic solvent. Next, the aluminum porous body filled with the positive electrode mixture was subjected to compression-press forming by a roller press. In this way, a positive electrode material using each of the aluminum porous bodies was finished.

Finally, from each of the produced positive electrode materials, a sample of 15 mm diameter was punched out. The resultant samples, which were yielded by punching out the aluminum porous bodies 8 to 11, were named positive electrode samples 8 to 11, respectively. The aluminum porous bodies 8 and 10 of 1000 μm thickness were each compressed into a thickness of 500 μm, and designed to set the capacity density per unit area, which was obtained from the mass of the positive electrode active material, to 10 $mAh/cm^2$. The aluminum porous bodies 9 and 11 of 1500 μm thickness were each compressed into a thickness of 750 μm, and designed to set the capacity density per unit area, which was obtained from the mass of the positive electrode active material, to 15 $mAh/cm^2$.

Next, the positive electrode samples 8 to 11 were used to produce electrolyte type lithium secondary batteries, respectively, and evaluate the positive electrode samples. The evaluating batteries were produced as follows:

About each of the positive electrode samples 8 and 10, a lithium (Li) metal foil (diameter: 15 mm, and thickness: 500 μm) was used as its negative electrode. The positive electrode (positive electrode sample) and the negative electrode were laminated onto each other to interpose a separator (thickness: 25 μm) made of polypropylene therebetween. At this time, about the positive electrode sample 8, the positive electrode was arranged to face, toward the negative electrode, the surface of the large-pore-diameter side (large-cell-diameter region side) of the aluminum porous body. A terminal member was attached to each of the electrodes, and the resultant was immersed in an organic electrolyte put in a vessel. In this way, evaluating batteries were produced. The used organic electrolyte was a solution wherein $LiPF_6$ was dissolved in a mixed organic solvent of ethylene carbonate (EC) and diethyl carbonate (DEC) (ratio by volume: 1:1) to give a concentration of 1 M (mol/L).

About each of the positive electrode samples 9 and 11, a negative electrode, separators and an organic electrolyte used therein were the same as about the positive electrode samples 8 and 10. These were laminated in the following order: negative electrode/separator/positive electrode (positive electrode sample)/separator/negative electrode. At this time, the positive electrode samples 9 and 11 were arranged to face, toward the negative electrode, the surface of the large-pore-diameter side (large-cell-diameter region side) of the aluminum porous body. A terminal member was attached to each of the electrodes, and the resultant was immersed in an organic electrolyte put in a vessel. In this way, evaluating batteries were produced.

The evaluating batteries using the respective positive electrode samples were evaluated as follows: In the evaluation, charge/discharge cycles were made at cutoff voltages of 4.2 to 3.0 V and respective current densities of 0.2 C and 2 C. At this time, the batteries were each measured about the initial discharge capacity. From the measured initial discharge capacity, the discharge capacity per unit mass of the positive electrode active material was calculated by conversion. The respective discharge capacities of the batteries are shown in Table 3.

TABLE 3

| Positive electrode sample | Al porous body (structure) | Discharge capacity (mAh/g) at current density of 0.2 C | Discharge capacity (mAh/g) at current density of 2 C |
| --- | --- | --- | --- |
| 8 | Bilayered | 120 | 110 |
| 9 | Trilayered | 120 | 110 |
| 10 | Monolayered | 120 | 90 |
| 11 | Monolayered | 120 | 90 |

As shown in Table 3, about the positive electrode samples 8 to 11, wherein the aluminum porous bodies 8 to 11 were used as their current collectors, respectively, a difference was hardly found out between the discharge capacities at the low-rate-discharge, wherein the current density was low. However, at the high-rate-discharge, wherein the current density was high, the positive electrode samples 8 and 9, wherein the aluminum porous bodies 8 and 9 were used as their current collectors, respectively, were higher in discharge capacity than the positive electrode samples 10 and 11, wherein the aluminum porous bodies 10 and 11 were used as their current collectors, respectively. Thus, it is understood that aluminum porous bodies 8 and 9 can improve a discharge characteristic of a battery.

The reason therefor would be as follows: (i) the aluminum porous bodies each have the large-cell-diameter region(s) and the small-cell-diameter region in the thickness direction, so that the permeability of the organic electrolyte is high and the availability ratio of the active material is high. Additionally, in each of the positive electrode samples 8 to 11, the oxygen content in the aluminum porous body surface functioning as the current collector is 3.1% by mass or less, which is very small; thus, donation and reception of electrons are rapidly attained between the porous body and the active material.

The above has described the present invention on the basis of embodiments thereof, however, the present invention is not limited to the embodiments. Within the scope of the present invention and any scope equivalent thereto, various modifications may be added to the embodiments.

INDUSTRIAL APPLICABILITY

The use of the three-dimensional net-like aluminum porous body of the present invention as a base of an electrode makes it possible to improve the current collecting performance of a central region in the thickness direction of the electrode, and the availability ratio of the active material inside the electrode. Furthermore, the use makes it possible to improve the electrode in holding performance of the active material, and in windability. Thus, the aluminum porous body of the present invention can be used suitably as a base in industrial and continuous production of electrodes for, for example, nonaqueous electrolyte batteries (such as lithium batteries), and nonaqueous electrolyte condensers.

REFERENCE SIGN LIST

1: resin porous body
2: conductive layer
3: aluminum plating layer
21a and 21b: plating tank
22: band-form resin
23 and 28: plating bath
24: cylindrical electrode
25 and 27: positive electrode
26: electrode roller
32: compressing tool
33: compressed region
34: aluminum porous body
35: rotatable roller
36: roller rotation axis
41: winding-back roller
42: compressing roller
43: compressing/welding roller
44: filling roller
45: drying machine
46: compressing roller
47: cutting roller
48: winding-up roller
49: lead supplying roller
50: slurry supplying nozzle
51: slurry
60: lithium battery
61: positive electrode
62: negative electrode
63: electrolyte layer
64: positive electrode layer (positive electrode body)
65: current collector of positive electrode
66: negative electrode layer
67: negative electrode current collector
121: positive electrode
122: negative electrode
123: separator
124: holding plate
125: spring
126: pressing member
127: case
128: positive electrode terminal
129: negative electrode terminal
130: lead wire
141: polarizable electrode
142: separator
143: organic electrolyte
144: lead wire
145: case

The invention claimed is:
1. A planar three-dimensional network aluminum porous body, for a current collector, comprising:
   a first cell-diameter region in a thickness direction of the porous body, the first cell-diameter region having a first cell diameter of the porous body in the thickness direction, the first cell diameter being based on a reciprocal number of skeleton ribs in the first cell-diameter region, and the first cell diameter being defined as a first average given by:
   (a unit length)/(a first number of cells); and
   a second cell-diameter region in the thickness direction of the porous body, the second cell-diameter region having in the thickness direction a second cell diameter of the porous body that is smaller than the first cell diameter, the second cell diameter being based on a reciprocal number of skeleton ribs in the second cell-diameter region, and the second cell diameter being defined as a second average given by:
   (the unit length)/(a second number of cells), wherein a plurality of the skeleton ribs in the first cell-diameter region and the second cell-diameter region are hollow and have a uniform thickness aluminum layer, and a cross section in the thickness direction of the porous body has three regions laminated to each other including a region 1 of the first cell diameter, a region 2 of the second cell diameter, and a region 3 of the first cell diameter, in order, and a ratio of the average cell diameter of the region 1 and the region 3 to the cell diameter of the region 2 is 1.1 to 1.58.

2. The planar three-dimensional network aluminum porous body according to claim 1, wherein an oxygen content in a surface of the porous body is 3.1% by mass or less.

3. The planar three-dimensional network aluminum porous body according to claim 1, wherein a thickness of the second cell-diameter region is at most 750 μm.

4. An electrode wherein the planar three-dimensional network aluminum porous body as recited in claim 1 is used.

5. A nonaqueous electrolyte battery wherein the electrode as recited in claim 4 is used.

6. A capacitor using a nonaqueous electrolyte wherein the electrode as recited in claim 4 is used.

* * * * *